(12) United States Patent
Nagata

(10) Patent No.: US 10,672,897 B2
(45) Date of Patent: Jun. 2, 2020

(54) SEMICONDUCTOR DEVICE AND MANUFACTURING METHOD THEREFOR

(71) Applicant: RENESAS ELECTRONICS CORPORATION, Tokyo (JP)

(72) Inventor: Nao Nagata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/175,386

(22) Filed: Oct. 30, 2018

(65) Prior Publication Data

US 2019/0181255 A1 Jun. 13, 2019

(30) Foreign Application Priority Data

Dec. 8, 2017 (JP) ................... 2017-236455

(51) Int. Cl.
| | | |
|---|---|---|
| *H01L 29/739* | (2006.01) | |
| *H01L 29/06* | (2006.01) | |
| *H01L 29/66* | (2006.01) | |
| *H01L 29/10* | (2006.01) | |
| *H01L 29/40* | (2006.01) | |
| *H01L 29/08* | (2006.01) | |
| *H01L 29/417* | (2006.01) | |

(52) U.S. Cl.
CPC ...... *H01L 29/7397* (2013.01); *H01L 29/0619* (2013.01); *H01L 29/0638* (2013.01); *H01L 29/0696* (2013.01); *H01L 29/0834* (2013.01); *H01L 29/1095* (2013.01); *H01L 29/401* (2013.01); *H01L 29/407* (2013.01); *H01L 29/417* (2013.01); *H01L 29/66348* (2013.01); *H01L 29/7396* (2013.01)

(58) Field of Classification Search
CPC ............. H01L 29/0696; H01L 29/0804; H01L 29/7393; H01L 29/7395; H01L 29/7397
See application file for complete search history.

(56) References Cited

U.S. PATENT DOCUMENTS

| | | | |
|---|---|---|---|
| 9,041,050 B2 | 5/2015 | Matsuura | |
| 9,478,614 B2 | 10/2016 | Onozawa et al. | |
| 9,818,851 B2 | 11/2017 | Nagata | |
| 2012/0313139 A1* | 12/2012 | Matsuura | ............... H01L 29/36 257/139 |

(Continued)

FOREIGN PATENT DOCUMENTS

| | | |
|---|---|---|
| JP | 2013-140885 A | 7/2013 |
| JP | 2016-184622 A | 10/2016 |
| WO | 2015/022989 A1 | 2/2015 |

*Primary Examiner* — Jae Lee

(74) *Attorney, Agent, or Firm* — McDermott Will & Emery LLP

(57) ABSTRACT

To enhance the performance of a semiconductor device. Gate electrodes extending in a Y direction and applied with a gate potential, and emitter regions and base regions both applied with an emitter potential are formed in an active cell area. The plural emitter regions are formed so as to be separated from each other in the Y direction by the base regions. A plurality of hole discharge cell areas having a ring-shaped gate electrode applied with an emitter potential are formed within an inactive cell area. The hole discharge cell areas are arranged to be separated from each other along the Y direction. Thus, an input capacitance of an IGBT is reduced, and a switching loss at turn on of the IGBT is improved.

16 Claims, 28 Drawing Sheets

(56) References Cited

U.S. PATENT DOCUMENTS

| | | | |
|---|---|---|---|
| 2015/0069461 A1* | 3/2015 | Misu | H01L 29/7397 |
| | | | 257/139 |
| 2015/0263150 A1* | 9/2015 | Matsudai | H01L 29/407 |
| | | | 257/139 |
| 2016/0336393 A1* | 11/2016 | Kim | H01L 29/0619 |
| 2018/0226398 A1* | 8/2018 | Ogura | H01L 29/0834 |

* cited by examiner

A-A SECTION

A-A SECTION

A-A SECTION

A-A SECTION

A-A SECTION

A-A SECTION

A-A SECTION

E-E SECTION

D-D SECTION

SEMICONDUCTOR DEVICE AND MANUFACTURING METHOD THEREFOR

CROSS-REFERENCE TO RELATED APPLICATIONS

The disclosure of Japanese Patent Application No. 2017-236455 filed on Dec. 8, 2017 including the specification, drawings and abstract is incorporated herein by reference in its entirety.

BACKGROUND

The present invention relates to a semiconductor device and a manufacturing method therefor, and is suitably applicable to a semiconductor device equipped with an insulated gate bipolar transistor (IGBT), for example.

A trench gate type IGBT has widely been used as an IGBT low in on resistance, i.e., an IGBT low in forward saturation voltage Vce (sat). There has been developed an IE type IGBT which makes an IE (Injection Enhancement) effect available by alternately arranging an active cell area having a gate electrode for a gate potential electrode, and an emitter region for an emitter potential electrode, and an inactive cell area including a p-type floating region. The IE effect is intended to make positive holes harder to be discharged from the emitter potential electrode side when the IGBT is in an on state, to thereby enhance the concentration of an electric charge accumulated in a drift region.

There has been disclosed in Japanese Unexamined Patent Application Publication No. 2013-140885 (Patent Document 1), an IE type IGBT having a structure (GGEE type structure) in which two trench gates adjacent to each other are respectively coupled to an emitter potential in addition to a GG structure in place of an IE type IGBT having a structure (GG type structure) in which two trench gates adjacent to each other are respectively coupled to a gate potential.

There has been disclosed in FIG. 4 of International Publication No. 2015/022989 (Patent Document 2), a technology of narrowing between trench gates coupled to an emitter potential in a GGEE type structure and separating the trench gates coupled to the emitter potential in a direction in which the trench gates extend.

There has been disclosed in Japanese Unexamined Patent Application Publication No. 2016-184622 (Patent Document 3), a problem that a displacement current is generated through a gate due to a potential fluctuation in a floating region in an EGE type structure being a structure similar to the GG type structure and the GGEE type structure.

RELATED ART DOCUMENTS

Patent Document

[Patent Document 1] Japanese Unexamined Patent Application Publication No. 2013-140885
[Patent Document 2] International Publication No. 2015/022989
[Patent Document 3] Japanese Unexamined Patent Application Publication No. 2016-184622

SUMMARY

In the GG type structure, with a change in collector voltage during a switching operation, holes accumulated in the surface of a floating region formed between trench gates coupled to a gate potential vary the potential of the floating region. With the potential variation in the floating region, a displacement current is generated through a gate, thereby causing problems such as deterioration in switching loss, lowering in breakdown strength, current vibrations, voltage vibrations, and surges, etc.

In order to cope with these problems, a GGEE type structure is provided which forms a parasitic p-type MOSFET (Metal Oxide Semiconductor Field Effect Transistor) by a trench gate coupled to an emitter potential and discharges holes by the parasitic p-type MOSFET, thereby making it possible to suppress the potential variation in the floating region.

In the GGEE structure, however, a problem arises in that a tendency that an input capacitance becomes large, and di/dt and dv/dt are reduced becomes large, thereby making it easy to deteriorate the switching loss of an IGBT.

Other objects and novel features will become apparent from the description of the present specification and the accompanying drawings.

A summary of a typical one of embodiments disclosed in the present application will be described in brief as follows:

A semiconductor device according to one embodiment includes a first area, a second area, and a plurality of third areas each having a first electrode which extends in a first direction and is applied with a gate potential in the first area, a third impurity region of a first conductivity type and a second impurity region of a second conductivity type both applied with an emitter potential in the first area, and a ring-shaped second gate electrode applied with an emitter potential in the second area. Here, the plural third impurity regions are formed so as to separate from each other in the first direction by the second impurity region. The third areas are arranged separated from each other along the first direction.

According to one embodiment, it is possible to enhance the performance of a semiconductor device.

DETAILED DESCRIPTION

Figure 1:
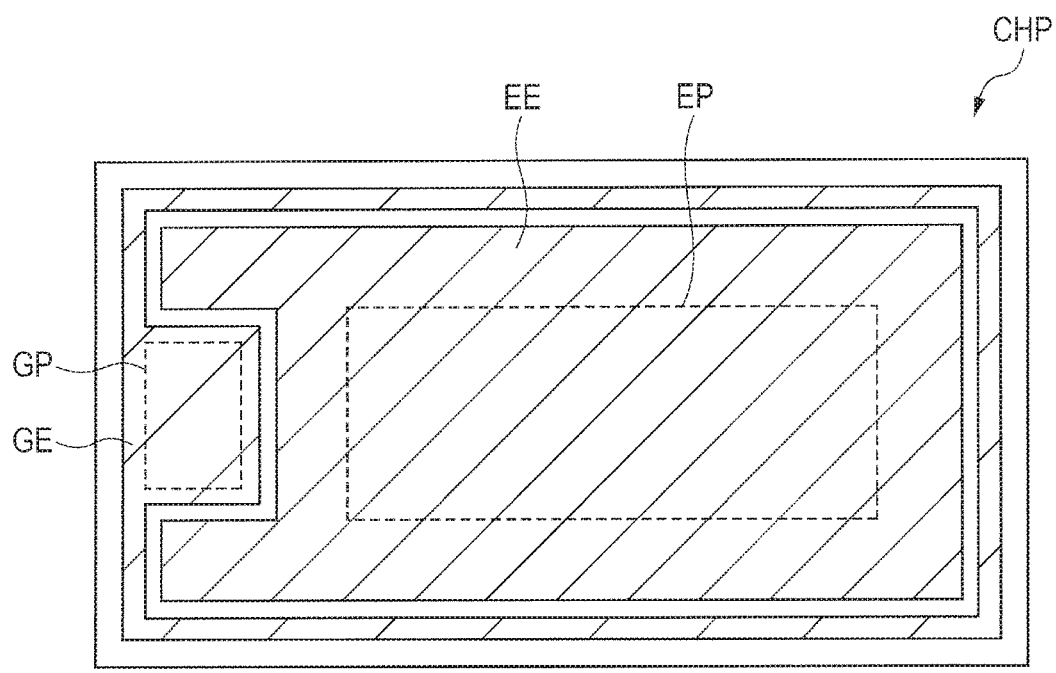
FIG. 1 is a plan diagram of a semiconductor chip as a semiconductor device according to an embodiment 1.

The invention will be described by being divided into a plurality of sections or embodiments whenever circumstances require it for convenience in the following embodiments. However, unless otherwise specified in particular, they are not irrelevant to one another. One thereof has to do with modifications, details, supplementary explanations, etc. of some or all of the others. Also, when reference is made to the number of elements or the like (including the number of pieces, numerical values, quantity, range, etc.) in the following embodiments, the number thereof is not limited to a specific number and may be greater than or less than or equal to the specific number except for where otherwise specified in particular and definitely limited to the specific number in principle, etc. Further, in the following embodiments, it is needless to say that components (also including element steps, etc.) employed therein are not always essential except for where otherwise specified in particular and considered to be definitely essential in principle, etc. Similarly, when reference is made to the shapes or positional relations and the like of the components or the like in the following embodiments, they will include ones substantially analogous or similar to their shapes or the like except for where otherwise specified in particular and considered not to be definitely so in principle, etc. This is similarly applied even to the above-described numerical values and range.

Embodiments will hereinafter be described in detail on the basis of the accompanying drawings. Incidentally, in all of the drawings for explaining the embodiments, the same reference numerals are respectively attached to members having the same function, and their repetitive description will be omitted. Further, in the following embodiments, the description of the same or similar parts will not be repeated in principle at times other than a required time in particular.

Also, in the drawings employed in the embodiments, hatching might be omitted to make it easy to read the drawings.

Further, in the specification of the present application, the term "a conductivity type of a semiconductor being a p type" means that only positive holes may be charge carriers or both electrons and positive holes may be charge carriers, but on the other hand, the concentration of the positive holes is higher than that of the electrons, and the positive holes are main charge carriers. Also, in the specification of the present application, the term "the conductivity type of a semiconductor being an n type" means that only electrons may be charge carriers or both electrons and positive holes may be charge carriers, but on the other hand, the concentration of electrons is higher than that of the positive holes, and the electrons are main charge carriers.

Besides, in the specification of the present application, a switching operation to switch an IGBT from an off state to an on state is referred to as a "turn on", and a switching operation to switch the IGBT from an on state to an off state is referred to as a "turn off".

Embodiment 1

A semiconductor device according to an embodiment 1 will hereinafter be described in detail with reference to the accompanying drawings. The semiconductor device according to the present embodiment 1 is a semiconductor device equipped with an IE type IGBT having a new structure developed with a GGEE type structure as basic structure.

<Configuration of Semiconductor Device>

FIG. 1 is a plan diagram of a semiconductor chip CHP as the semiconductor device according to the present embodiment. For simple understanding, FIG. 1 shows a protective film PIQ (refer to FIG. 3) in a transmitted state. FIG. 1 is a plan diagram, but a gate potential electrode GE and an emitter potential electrode EE are shown hatched therein.

As shown in FIG. 1, the major part of the semiconductor chip CHP is covered with the emitter potential electrode EE. The gate potential electrode GE is formed at the outer periphery of the emitter potential electrode EE. An area surrounded by a broken line near the center part of the emitter potential electrode EE is an emitter pad EP. An area surrounded by a broken line for the gate potential electrode GE is a gate pad GP. The protective film PIQ provided over the emitter pad EP and the gate pad GP is removed. External coupling terminals such as wire bonding or clips (copper plates), etc. are coupled over the emitter pad EP and the gate pad GP, so that the semiconductor chip CHP is electrically coupled to another chip or a wiring board or the like.

Figure 2:
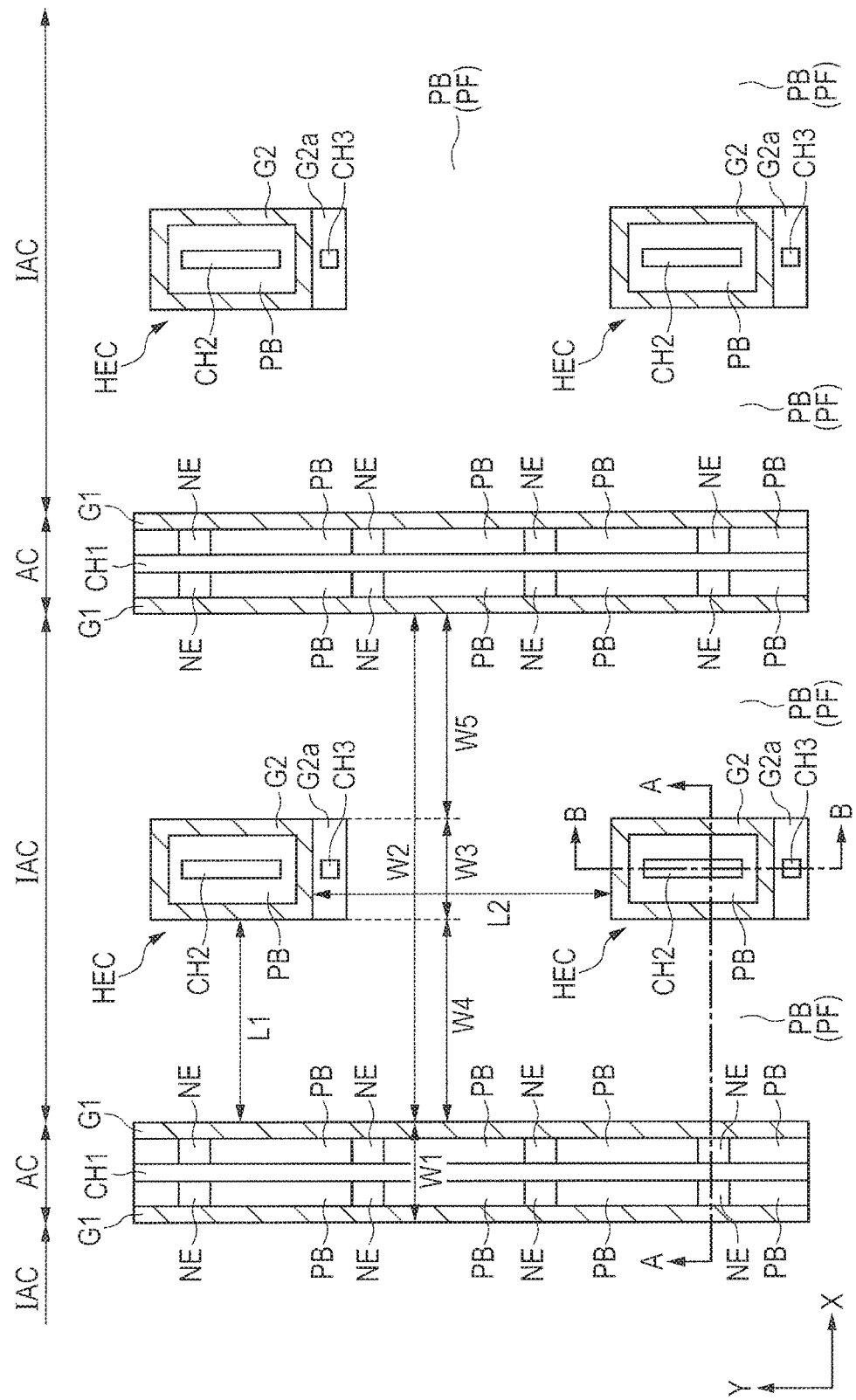
FIG. 2 is a fragmentary plan diagram of the semiconductor device according to the embodiment 1.
Figure 3:
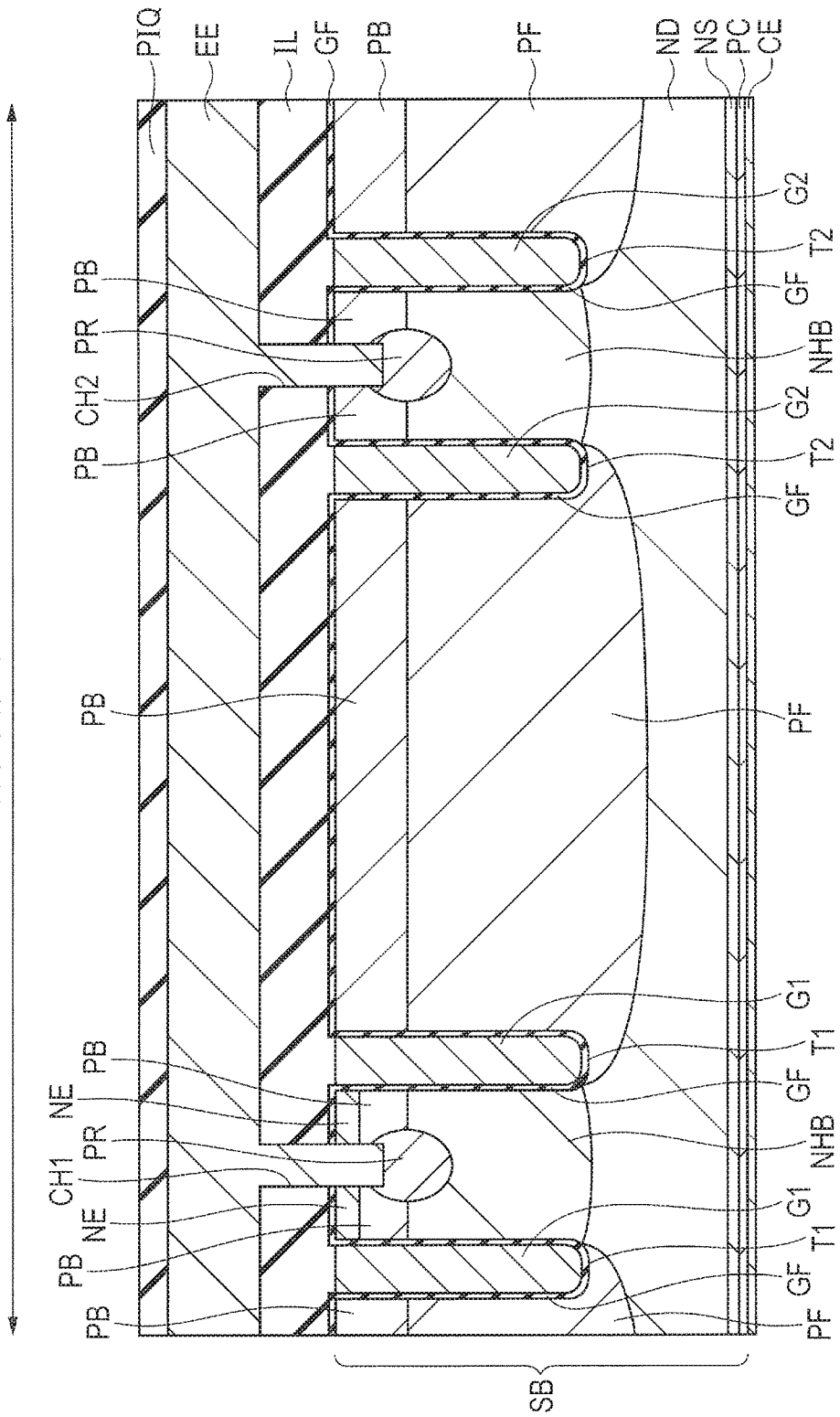
FIG. 3 is a sectional diagram of the semiconductor device according to the embodiment 1.
Figure 4:
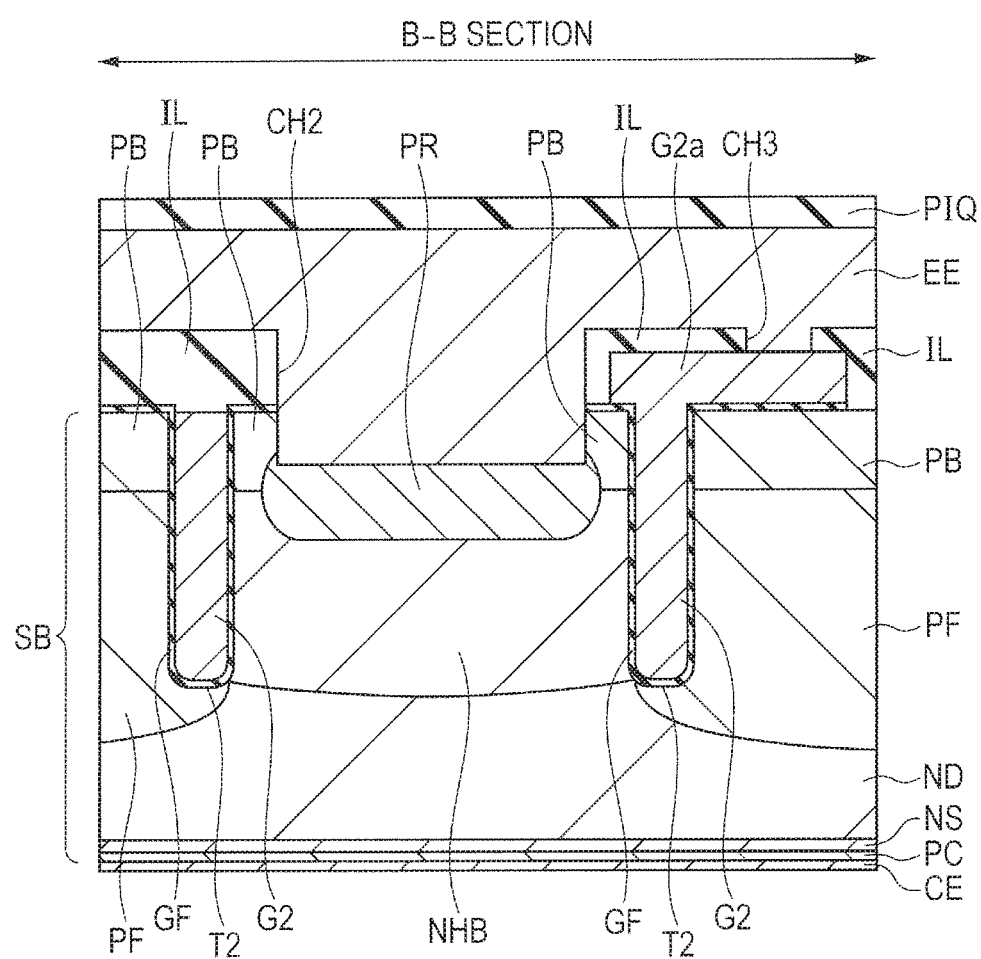
FIG. 4 is a sectional diagram of the semiconductor device according to the embodiment 1.

FIG. 2 is a fragmentary plan diagram of the semiconductor chip CHP and corresponds to a plan diagram below the emitter potential electrode EE. FIG. 3 is a sectional diagram taken along line A-A of FIG. 2. FIG. 4 is a sectional diagram taken along line B-B of FIG. 2.

Incidentally, although FIG. 2 is a plan diagram, gate electrodes G1 and gate electrodes G2 are hatched to make it easy to read the drawing. Incidentally, the gate electrodes G2 formed in trenches T2, of the gate electrodes G2 are hatched, but gate lead-out portions G2a located outside the trenches T2 are not hatched. Further, the illustration of the protective film PIQ, the emitter potential electrode EE, an interlayer insulating film IL, and a gate insulating film GF is omitted in FIG. 2.

The semiconductor device according to the present embodiment has gate electrodes G1 being trench gates electrically coupled to the gate potential electrode GE, and an area surrounded by the two gate electrodes G1. Further, the semiconductor device has an active cell area AC which performs a main operation of the IGBT, and an inactive cell area IAC other than the active cell area AC. The inactive cell area IAC is formed with gate electrodes G2 each being a trench gate electrically coupled to the emitter potential electrode EE, and hole discharge cell areas HEC each having a region surrounded by the gate electrode G2. A base region (impurity region) PB and a floating region (impurity region) PF are formed around the hole discharge cell area HEC.

The active cell area AC is an area which configures a main circuit of the IGBT in the present embodiment. In the active cell area AC, as shown in FIG. 2, the two gate electrodes G1 exist in a Y direction. The two gate electrodes G1 are arranged adjacent to each other in an X direction orthogonal to the Y direction. Although not illustrated in the drawing, each gate electrode G1 is coupled to the gate potential electrode GE shown in FIG. 1 in the outer peripheral part of the semiconductor chip CHP and applied with a gate potential at the time of the operation of the IGBT.

P-type base regions PB are formed in the surface of a semiconductor substrate SB in a region surrounded by the two gate electrodes G1. A plurality of n-type emitter regions (impurity regions) NE are formed at the surfaces of the base regions PB.

Each of the emitter regions NE and the base regions PB is in contact with a contact hole CH1 extending in the Y direction. The emitter potential electrode EE is embedded into the contact hole CH1. Incidentally, a p-type body region (impurity region) PR having an impurity concentration higher than that of the base region PB is formed in the semiconductor substrate SB below the contact hole CH1. Thus, the emitter regions NE, the base regions PB, and the body region PR are applied with an emitter potential at the time of the operation of the IGBT.

Further, the emitter regions NE are not formed over the entire surfaces of the base regions PB as viewed in the Y direction and the plural emitter regions NE are arranged at predetermined intervals. That is, the emitter regions NE are formed so as to be separated from each other in the Y direction by the base regions PB.

The inactive cell area IAC is an area other than the active cell area AC and an area having no emitter regions NE within the base regions PB. Further, the inactive cell area IAC has the hole discharge cell areas HEC. Between the two active cell areas AC adjacent in the X direction, the floating region PF is formed in a region except for the hole discharge cell areas HEC.

The hole discharge cell area HEC is not formed with the floating region PF, but formed with a hole barrier region NHB. The base region PB is formed above the hole barrier region NHB of the hole discharge cell area HEC, but no n-type emitter region NE is formed at the surface of the base region PB of the hole discharge cell area HEC unlike the active cell area AC.

As shown in FIG. 2, a plurality of annular (ring-shaped) gate electrodes G2 are formed in the hole discharge cell areas HEC in plan view. The ring-shaped gate electrodes G2 adjacent to each other are not integrated with each other in the Y direction and are physically separated from each other. In the hole discharge cell areas HEC, the plural gate electrodes G2 are formed so as to surround some of the base region PB in each inactive cell area IAC in plan view.

In the present embodiment, each ring-shaped gate electrode G2 will be described in the form of a square as its one example. Each gate electrode G2 may be provided to surround the base region PB formed with the body region PR, or the contact hole CH2 in plan view, but is not necessarily limited to the square shape. The gate electrode G2 may be polygonal, circular or elliptical.

These gate electrodes G2 are respectively in contact with contact holes CH3 through the gate lead-out portion G2a. The emitter potential electrode EE is embedded into the contact holes CH3. That is, each gate electrode G2 is applied with the emitter potential upon the operation of the IGBT.

The base region PB surrounded by the gate electrode G2 is in contact with the contact hole CH2. The emitter potential electrode EE is embedded into the contact hole CH2. Incidentally, the p-type body region PR is formed in the semiconductor substrate SB below each contact hole CH2. Thus, in the inactive cell area IAC, the base region PB and the body region PR are applied with the emitter potential at the time of the operation of the IGBT.

In the inactive cell area IAC, a region other than each hole discharge cell area HEC is a region formed with the floating region PF. That is, the floating region PF is formed between the hole discharge cell areas HEC adjacent in the Y direction and between the active cell area AC and the hole discharge cell area HEC both adjacent in the X direction.

As shown in FIG. 2, when the width of the active cell area AC is assumed to be W1 and the width of the inactive cell area IAC is assumed to be W2 in the X direction, W1:W2 ranges from 1:5 to 1:9. Also, it is most preferable that W1:W2 is 1:7. Further, W2 corresponding to the width of the inactive cell area IAC is comprised of W4 corresponding to the width of the floating region PF, W3 corresponding to the width of the hole discharge cell area HEC, and W5 corresponding to the width of the floating region PF. W1:W4:W3:W5 falls within a range from 1:2:1:2 to 1:4:1:4. Further, it is most preferable that W1:W4:W3:W5 is 1:3:1:3. In other words, the width W1 is a width between the gate electrodes G1 adjacent to each other in the X direction, the width W4 is a width between the gate electrodes G1 and G2 adjacent in the X direction, the width W3 is a width between the gate electrodes G2 adjacent to each other in the X direction, and the width W5 is a width between the gate electrodes G2 and G1 adjacent to each other in the X direction.

A sectional structure of the semiconductor device according to the present embodiment will next be described using FIGS. 3 and 4.

The semiconductor substrate SB is formed with a drift region (impurity region) ND being a low concentration n-type impurity region. An n-type field stop region (impurity region) NS having an impurity concentration higher than that of the drift region ND, a p-type collector region (impurity region) PC, and a collector potential electrode CE comprised of a metal film are formed on the back surface side of the semiconductor substrate SB than the drift region ND. That is, a collector potential is applied to the collector region PC through the collector potential electrode CE at the time of the operation of the IGBT.

Trenches T1 and T2 are formed on the surface side of the semiconductor substrate SB. The gate electrode G1 and the gate electrode G2 are respectively embedded into the trench T1 and the trench T2 through the gate insulating film GF. As described above, the gate electrode G1 is coupled to the gate potential electrode GE and applied with the gate potential. Further, the gate electrode G2 is coupled to the emitter potential electrode EE and applied with the emitter potential. Besides, the gate insulating film GF is, for example, a silicon oxide film, and each of the gate electrodes G1 and G2 is, for example, a polysilicon film in which an n-type impurity is introduced.

A p-type floating region PF is formed in the semiconductor substrate SB between the gate electrodes G1 and G2. A p-type base region PB having an impurity concentration higher than that of the floating region PF is formed over the surface of the floating region PF. The floating region PF is preferably formed up to a position deeper than the bottom of the trench T1 and the bottom of the trench T2 to enhance an IE effect. The floating region PF is more preferably formed so as to cover the bottom of the trench T1 and the bottom of the trench T2.

A hole barrier region NHB having an impurity concentration higher than that of the drift region ND is formed in the semiconductor substrate SB between the two gate electrodes G1 and between the two gate electrodes G2. A p-type base region PB is formed at the surface of the hole barrier region NHB. An n-type emitter region NE having an impurity concentration higher than that of the hole barrier region NHB is formed over each p-type base region PB (p-type base region PB in active cell area AC) between the two gate electrodes G1. However, no emitter region NE is formed over the p-type base region PB (p-type base region PB of hole discharge cell area HEC) between the two gate electrodes G2.

A part of the gate insulating film GF is formed over the emitter region NE and the base region PB. An interlayer insulating film IL is formed at the part of the gate insulating film GF and the upper surface of each of the gate electrodes G1 and G2. Further, contact holes CH1 and CH2 are formed to penetrate through the interlayer insulating film IL, the gate insulating film GF, and the semiconductor substrate SB. In the active cell area AC, the contact hole CH1 is formed to be in contact with the emitter regions NE and the base regions PB. In the hole discharge cell area HEC, the contact hole CH2 is formed to be in contact with the base region PB.

The bottom of each of the contact holes CH1 and CH2 is disposed within the base region PB and does not reach the hole barrier region NHB. A p-type body region PR having an impurity concentration higher than that of the base region PB is formed around the bottom of each of the contact holes CH1 and CH2. The body region PR is formed to straddle the base region PB and the hole barrier region NHB. In the active cell area AC, the body region PR is formed so as not to be in contact with each emitter region NE. Incidentally, the body region PR is provided to reduce a contact resistance with the emitter potential electrode EE embedded into each of the contact hole CH1 and the contact hole CH2 and prevent a latch-up.

Further, in the hole discharge cell area HEC as shown in FIG. 4, a part of the gate electrode G2 is led out to the outside of the trench T2 and configures a gate lead-out portion G2a. A contact hole CH3 is provided in the interlayer insulating film IL. The contact hole CH3 is coupled to the gate lead-out portion G2a being the gate electrode G2 outside the trench T2.

The emitter potential electrode EE is formed over the interlayer insulating film IL and embedded into the contact holes CH1 through CH3. Thus, in the active cell area AC, the emitter potential is applied to the emitter regions NE, the base regions PB, and the body region PR. In the hole discharge cell area HEC, the emitter potential is applied to the gate electrode G2, the base region PB, and the body region PR. Incidentally, the contact holes CH1 through CH3 and the like are not arranged in the floating region PF of the inactive cell area IAC. Therefore, the emitter potential and the gate potential are not applied to the floating region PF.

A protective film PIQ comprised of, for example, a resin such as polyimide or the like is formed over the emitter potential electrode EE. Although not illustrated in FIGS. 3 and 4, the protective film PIQ is provided with an opening to expose each of a part of the emitter potential electrode EE and a part of the gate potential electrode GE. That is, the protective film PIQ is not formed in the areas (gate pad GP and emitter pad EP) each indicated by the broken line in FIG. 1.

Major features of the semiconductor device according to the present embodiment will be briefly described below. Incidentally, their detailed description will be described anew later using an examination example.

First, the hole discharge cell areas HEC are not continuously formed in the Y direction as in the active cell area AC and separated into a plurality of cells in the Y direction. Therefore, the facing area between the active cell area AC and each hole discharge cell area HEC adjacent in the X direction is reduced. That is, when the hole discharge cell area HEC of the inactive cell area IAC is compared with the active cell area AC continuously formed in the Y direction, the facing area between the gate electrode G1 and the gate electrode G2 adjacent in the X direction is reduced. Thus, since a capacitance Cge between the gate electrodes G1 and G2 is reduced when the collector potential is applied, an input capacitance Cies is reduced, so that reductions in di/dt and dv/dt are suppressed.

Also, since the area of the hole discharge cell area HEC is reduced as compared with the case where the active cell area AC is continuously formed in the Y direction, an IE effect is improved. Thus, a switching loss at the turn on of the IGBT is enhanced.

Further, when the width of the hole discharge cell area HEC in the X direction is made excessively small, the effect of discharging holes is reduced at the turn off, and the switching loss at the turn off is deteriorated. Therefore, the width of the hole discharge cell area HEC is the same as or becomes larger than the width of the active cell area AC in the X direction. In other words, in the X direction, the widths of the gate electrodes G2 adjacent to each other are the same as or larger than the widths of the gate electrodes G1 adjacent to each other.

Furthermore, in the present embodiment, as shown in FIG. 2, the distance (L2) between the two hole discharge cell areas HEC adjacent in the Y direction is made larger than the distance (L1) between the active cell area AC and the hole discharge cell area HEC adjacent in the X direction. Also, L1:L2 is designed to fall within a range from 1:6 to 1:11. By designing the distance L1 and the distance L2 to be such values, a potential fluctuation in the floating region PF can be suppressed, and deterioration in the switching loss at the turn on due to the deterioration in the IE effect can be suppressed.

Here, the distance L1 is the shortest distance between the gate electrode G1 embedded into the trench T1 and the gate electrode G2 embedded into the trench T2 as viewed in the X direction. The distance L2 is the shortest distance between the two gate electrodes G2 adjacent to each other and embedded into the trenches T2 as viewed in the Y direction.

Further, since a feedback capacitance Cres increases with a reduction in the area of the hole discharge cell area HEC, deterioration in off-surge voltage in a load short-circuit test is also improved.

In the present embodiment as described above, it is possible to improve the performance of the semiconductor device.

<Modification>

A semiconductor device according to a modification of the embodiment 1 will be described below using FIGS. 5 and 6.

In the embodiment 1, the gate electrode G2 in the hole discharge cell area HEC has been formed as one ring shape.

In the present modification, gate electrodes G2 are represented as a shape in which two rings are coupled.

Figure 5:
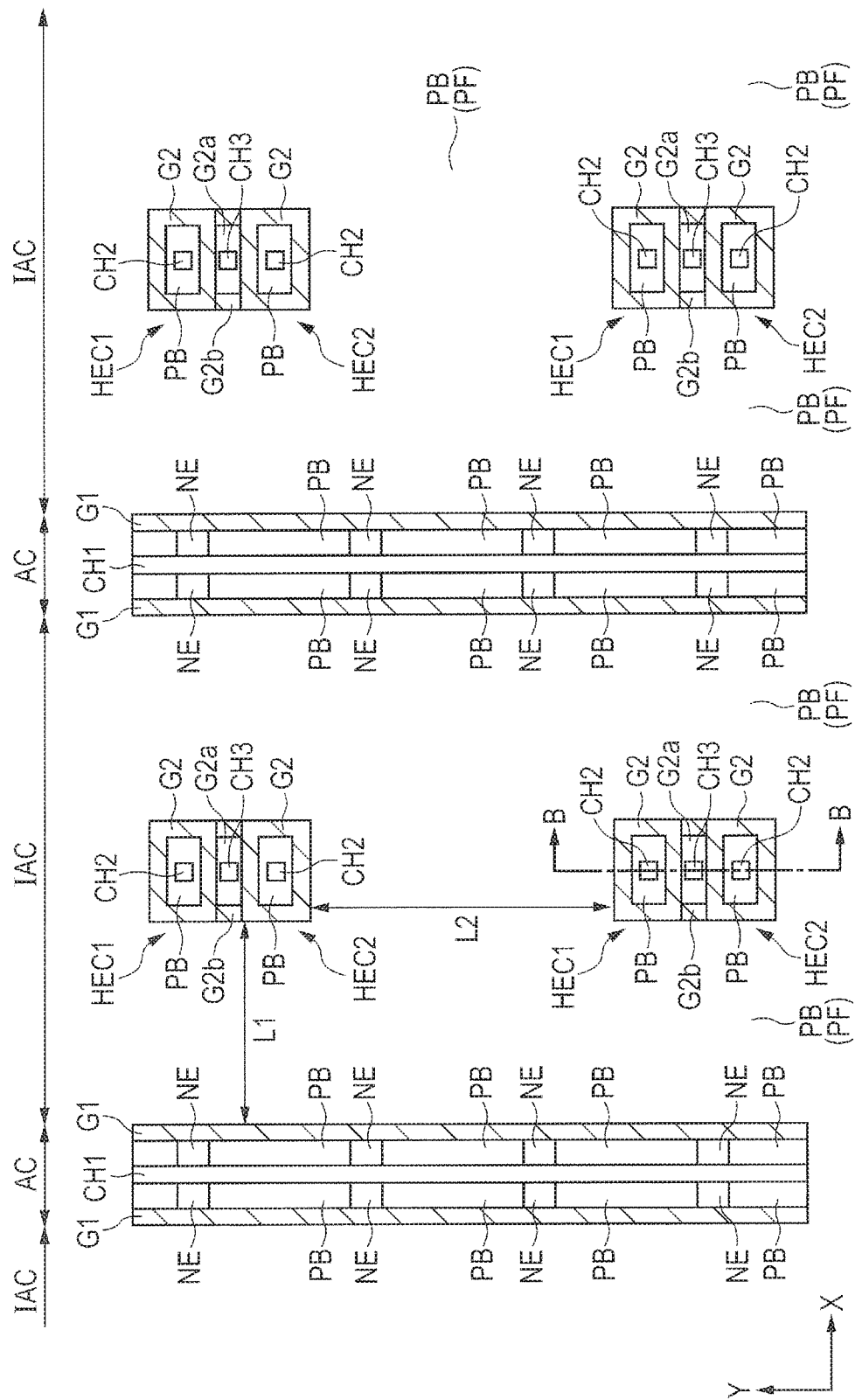
FIG. 5 is a fragmentary plan diagram of a semiconductor device according to a modification of the embodiment 1.

FIG. 5 is a fragmentary plan diagram of a semiconductor chip CHP as with FIG. 2 of the embodiment 1. FIG. 6 is a sectional diagram taken along line B-B of FIG. 5. Incidentally, in the present modification, the section taken along line A-A of FIG. 2 is similar to that of FIG. 3 of the embodiment 1, and its description will therefore be omitted.

Further, although FIG. 5 is a plan diagram, the gate electrodes G1 and G2 are hatched. Incidentally, of the gate electrodes G2, the gate electrodes G2 and coupling portions G2*b* formed in the trenches T2 are hatched, but a gate lead-out portion G2*a* located outside each trench T2 is not hatched.

As shown in FIG. 5, each hole discharge cell area HEC in the present modification is divided into a first part HEC1 and a second part HEC2. The first portion HEC1 and the second portion HEC2 respectively have ring-shaped gate electrodes G2. Further, the gate lead-out portion G2*a* is provided between these, and a contact hole CH3 is provided over the gate lead-out portion G2*a*.

Figure 6:
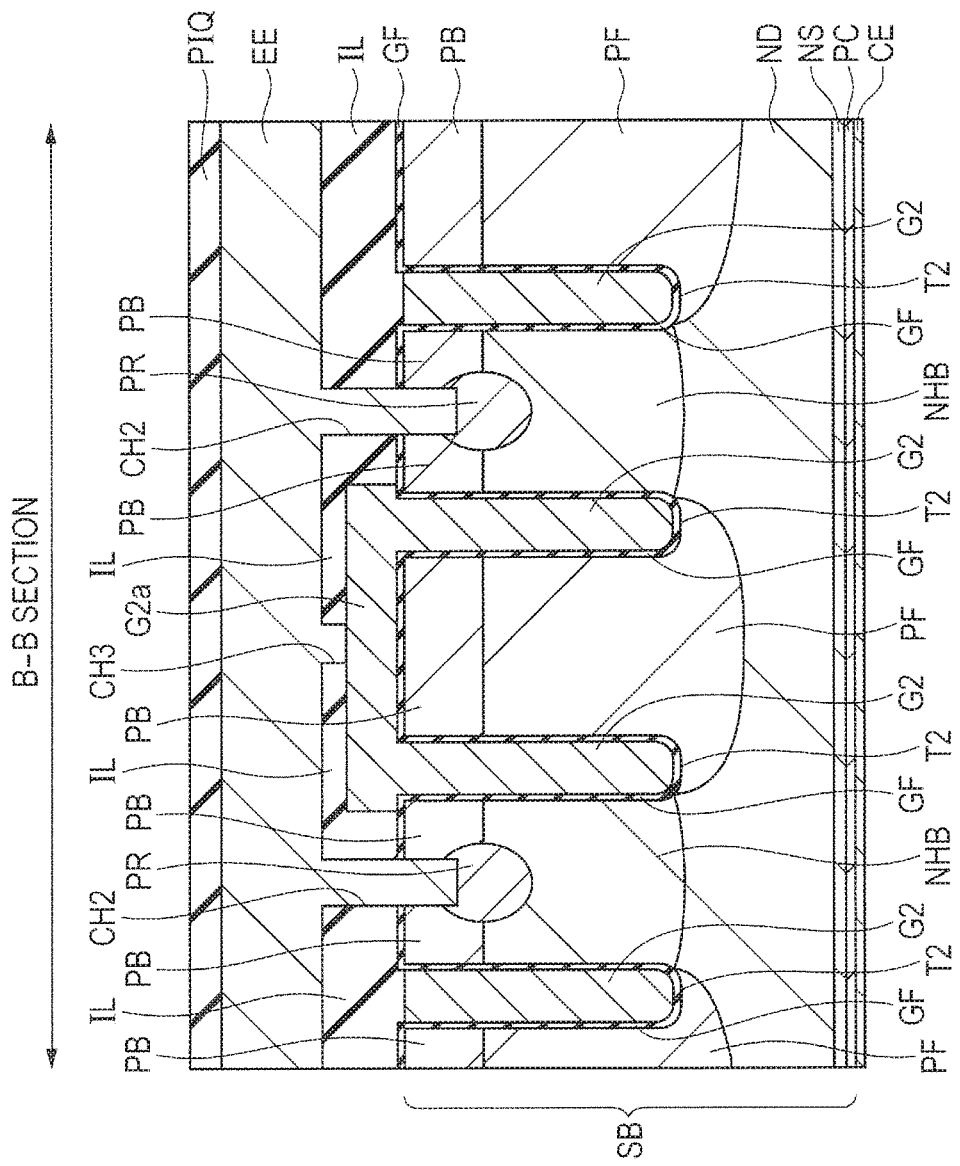
FIG. 6 is a sectional diagram of the semiconductor device according to the modification of the embodiment 1.

As shown in FIG. 6, parts of the gate electrodes G2 in the first part HEC1 and the second part HEC2 are led out to the outside of the trenches T2 to configure the gate lead-out portion G2*a*. The contact hole CH3 is arranged to be coupled to the gate lead-out portion G2*a*, and an emitter potential electrode EE is embedded into the contact hole CH3. That is, the gate electrodes G2 of the first part HEC1 and the second part HEC2 are formed integrally with the gate lead-out portion G2*a* and electrically coupled to the emitter potential electrode EE.

Also, a coupling portion G2*b* formed in each trench T2 and made integral with each gate electrode G2 is formed between the first part HEC1 and the second part HEC2. Therefore, the gate electrodes G2 of the first part HEC1 and the second part HEC2 are coupled by not only the gate lead-out portion G2*a*, but also the coupling portion G2*b*.

Further, in plan view, the sum of the areas of regions surrounded by the gate electrodes G2 of the first part HEC1 and the second part HEC2 is approximately the same as the area of the region surrounded by the gate electrode G2 in the embodiment 1. Therefore, the amount of holes discharged from the hole discharge cell area HEC is almost the same between the embodiment 1 and the present modification. Also, in the present modification, the facing area between the gate electrodes G1 and G2 adjacent in an X direction is almost the same as that in the embodiment 1. Thus, even if as in the present modification, the planar shape of each gate electrode G2 in the hole discharge cell area HEC is changed, an effect nearly similar to that of the embodiment 1 can be obtained.

Furthermore, although the hole discharge cell area HEC is divided into the two parts (first part HEC1 and second part HEC2) in the present modification, the hole discharge cell area HEC may be divided into a plurality of parts like three or more parts.

Still further, the forming positions of the gate lead-out portion G2*a* and the contact hole CH3 are not limited between the first part HEC1 and the second part HEC2. Other positions may be used where they can be electrically coupled to the gate electrodes G2.

Still further, the formation of the coupling portion G2*b* maybe omitted, and the respective gate electrodes G2 of the first part HEC1 and the second part HEC2 may be coupled by only the gate lead-out portion G2*a*.

<Manufacturing Method of Semiconductor Device>

A method for manufacturing the semiconductor device according to the embodiment 1 will hereinafter be described using FIGS. 7 through 14. FIGS. 7 through 14 are manufacturing processes of the A-A section shown in FIG. 3. Incidentally, a method for manufacturing the semiconductor device according to the above modification is similar to that for the embodiment 1 except for the planar shape of the gate electrode G2.

Figure 7:
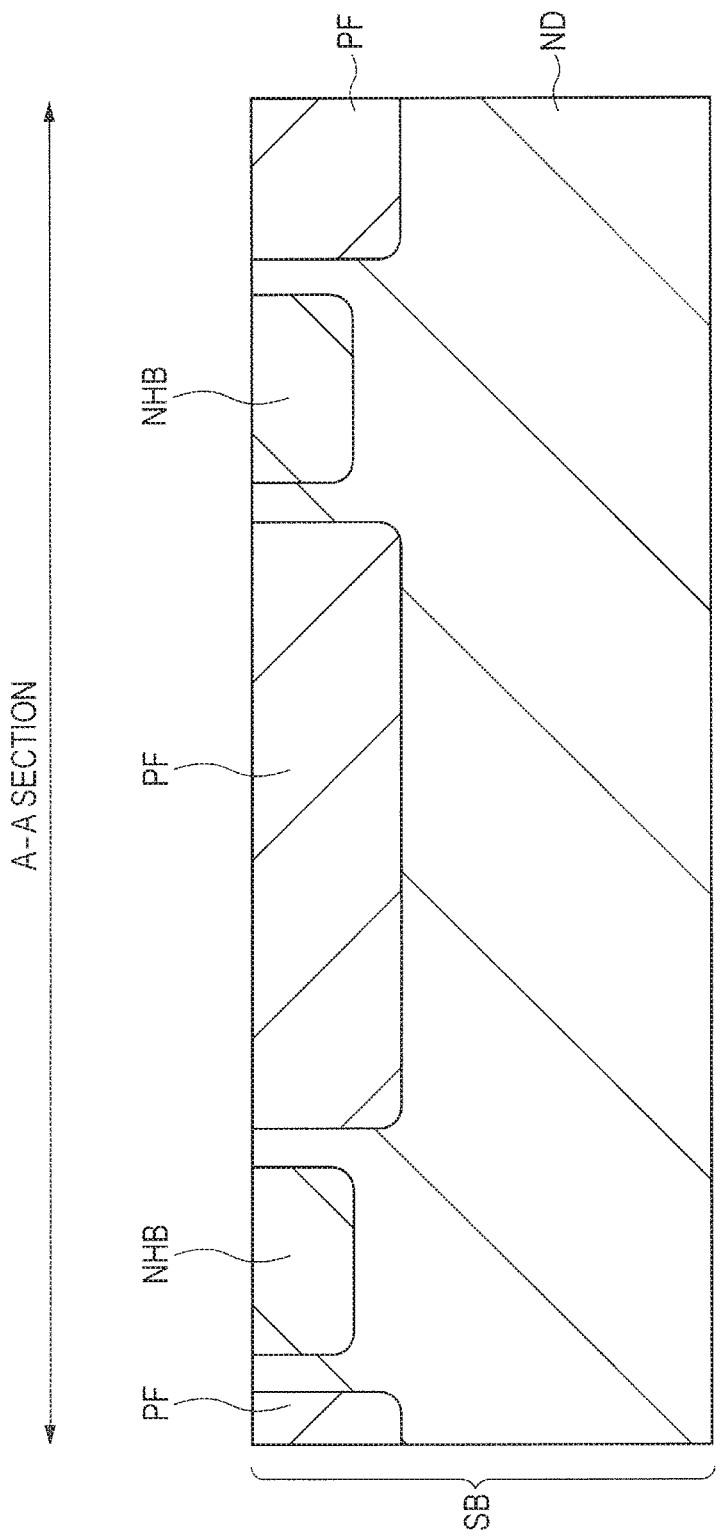
FIG. 7 is a sectional diagram showing a manufacturing process of the semiconductor device according to the embodiment 1.

FIG. 7 shows a process of forming a drift region ND, a hole barrier region NHB, and a floating region PF.

First, an n-type drift region ND is formed in a semiconductor substrate SB. The drift region ND is formed by providing a semiconductor substrate SB with an n-type impurity introduced therein in advance and using the n-type semiconductor substrate SB as the drift region ND. Alternatively, a p-type semiconductor substrate SB is provided, and the drift region ND is formed over the p-type semiconductor substrate SB by an epitaxial method. Incidentally, in the present embodiment, the drift region ND may be described as the semiconductor substrate SB.

Next, an n-type hole barrier region NHB and a p-type floating region PF are formed in the surface of the semiconductor substrate SB by using a photolithography method and an ion implantation method. The hole barrier region NHB has an impurity concentration higher than that of the drift region ND.

Figure 8:
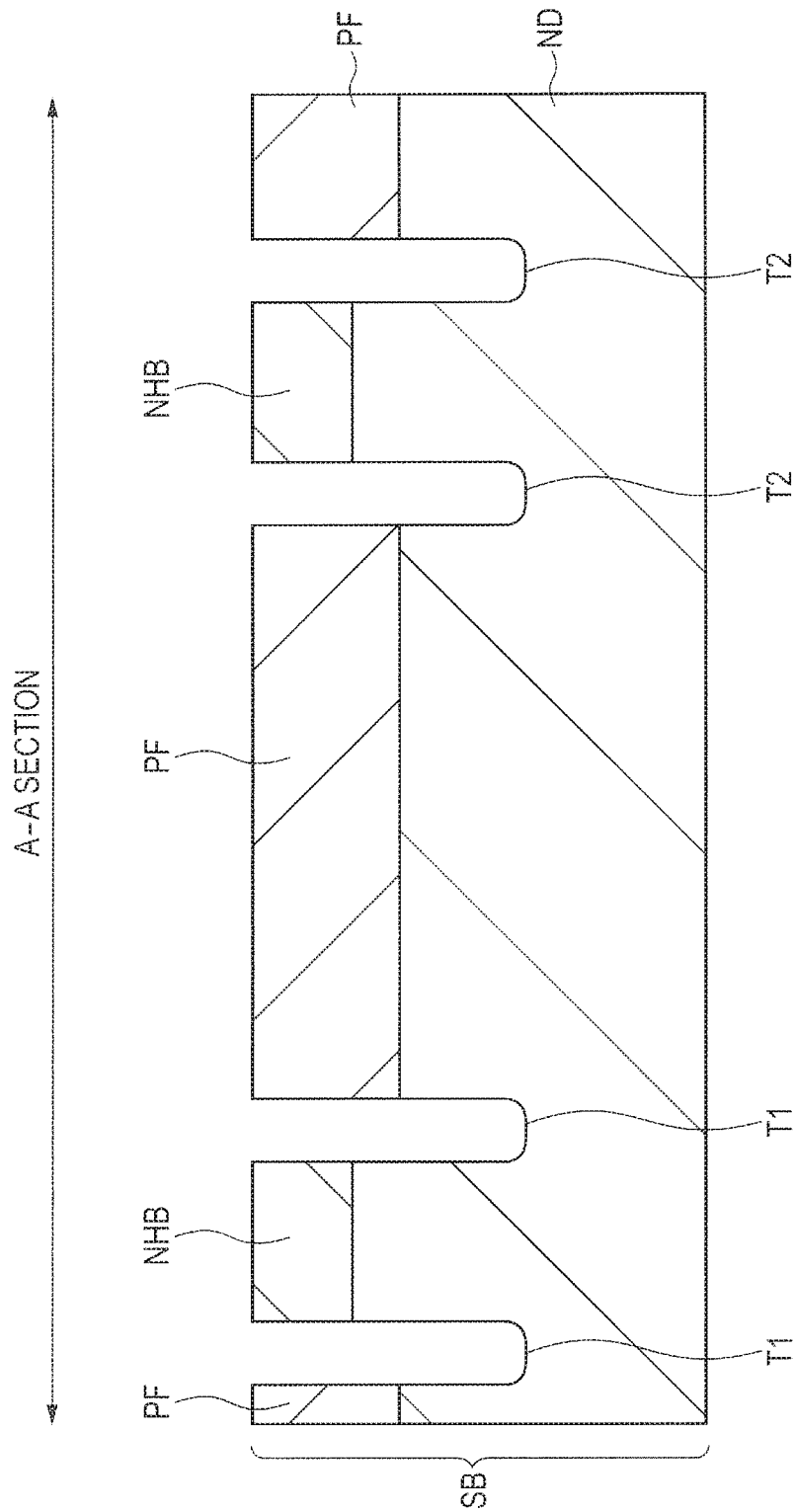
FIG. 8 is a sectional diagram showing a manufacturing process of the semiconductor device according to the embodiment 1.

FIG. 8 shows a process of forming trenches T1 and T2.

First, an insulating film comprised of, for example, a silicon oxide film is formed over the semiconductor substrate SB. The insulating film is patterned using the photolithography method and dry etching to form a hardmask. Next, the semiconductor substrate SB is etched with the hardmask as a mask to form the trenches T1 and T2 therein. Thereafter, the hardmask is removed.

Here, the trench T1 is continuously formed to extend in the Y direction in plan view as in each gate electrode G1 shown in FIG. 2. The trenches T2 are formed by being divided in plural form so as to shape rings in plan view as in the gate electrodes G2 shown in FIG. 2.

Figure 9:
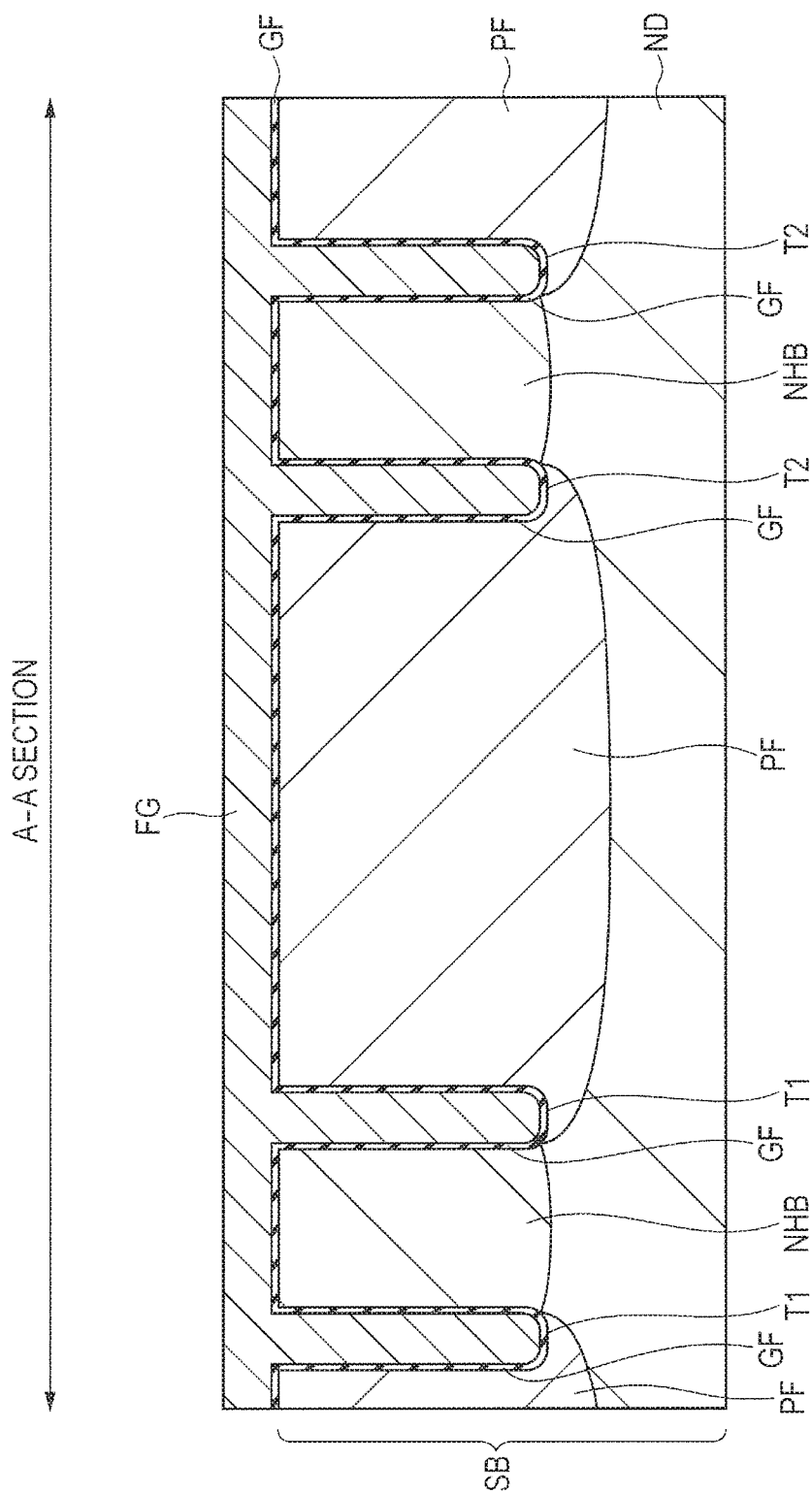
FIG. 9 is a sectional diagram showing a manufacturing process of the semiconductor device according to the embodiment 1.

FIG. 9 shows a heat treatment process and a process of forming a gate insulating film GF and a conductive film FG.

First, the semiconductor substrate SB is heat-treated to diffuse impurities included in the hole barrier region NHB and the floating region PF. With this heat-treatment, the hole barrier region NHB is diffused to near the bottom of each of the trenches T1 and T2. The floating region PF is diffused to a position deeper than the bottom of each of the trenches T1 and T2 so as to cover the bottom of each of the trenches T1 and T2.

Next, the semiconductor substrate SB is subjected to thermal oxidation treatment to form a gate insulating film GF comprised of, for example, a silicon oxide film over an inner wall of the trench T1, an inner wall of the trench T2, an upper surface of the floating region PF, and an upper surface of the hole barrier region NHB.

Next, a conductive film FG comprised of, for example, a polysilicon film with an n-type impurity introduced therein is formed over the gate insulating film GF by, for example, a CVD (Chemical Vapor Deposition) method so as to fill the inside of the trench T1 and the inside of the trench T2.

Figure 10:
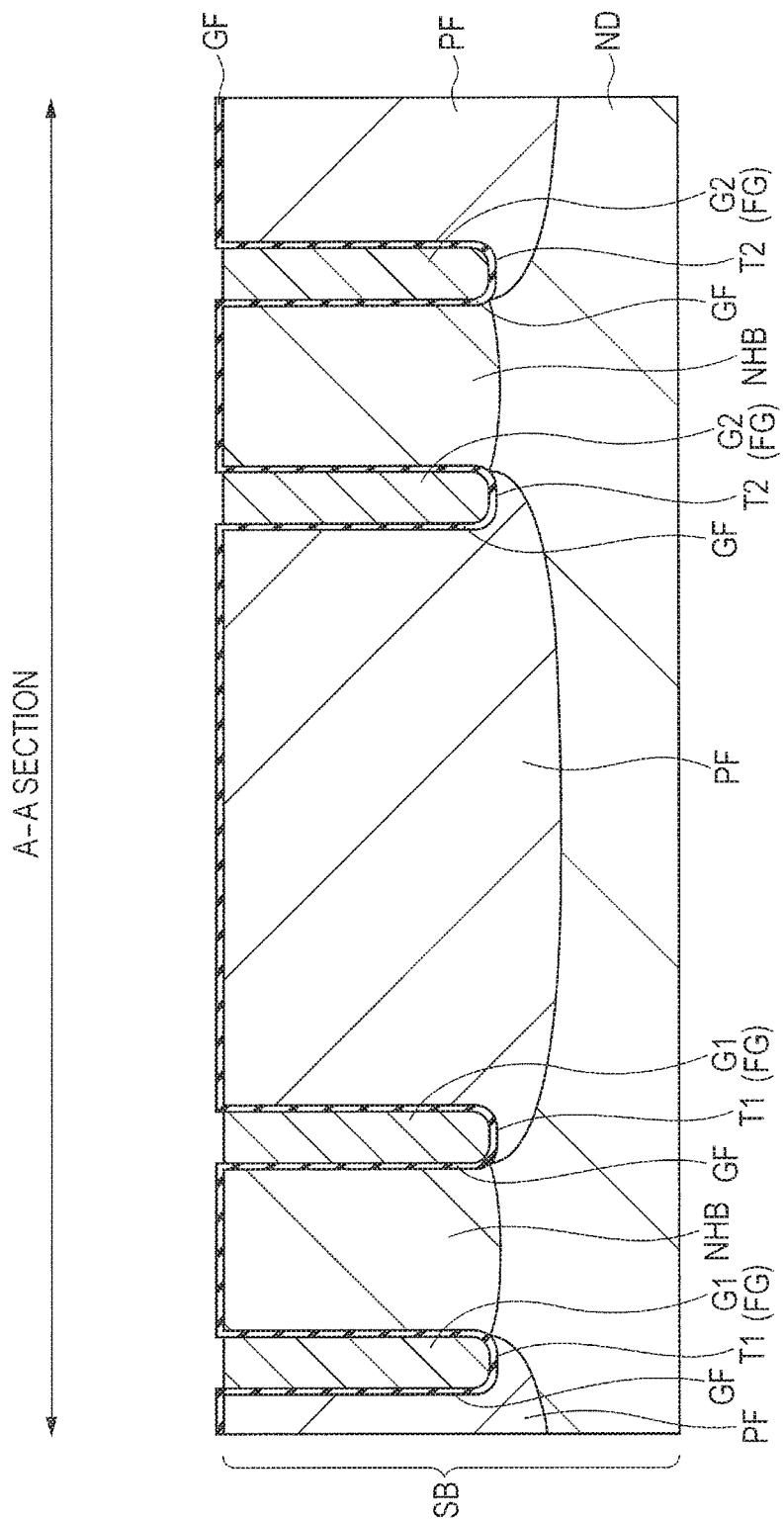
FIG. 10 is a sectional diagram showing a manufacturing process of the semiconductor device according to the embodiment 1.

FIG. 10 shows a process of forming gate electrodes G1 and G2.

First, the photolithography method and the dry etching are used for the conductive film FG to remove the conductive film FG formed outside the trenches T1 and T2. Then, the conductive film FG left inside the trenches T1 and T2 serves as the gate electrodes G1 and G2.

Incidentally, although not illustrated herein, a resist pattern is formed over a part of the conductive film FG outside each of the trenches T1 and T2. The conductive film FG covered with the resist pattern is processed as the gate lead-out portion G2a for coupling to the contact hole CH3 such as shown in FIG. 4.

Figure 11:
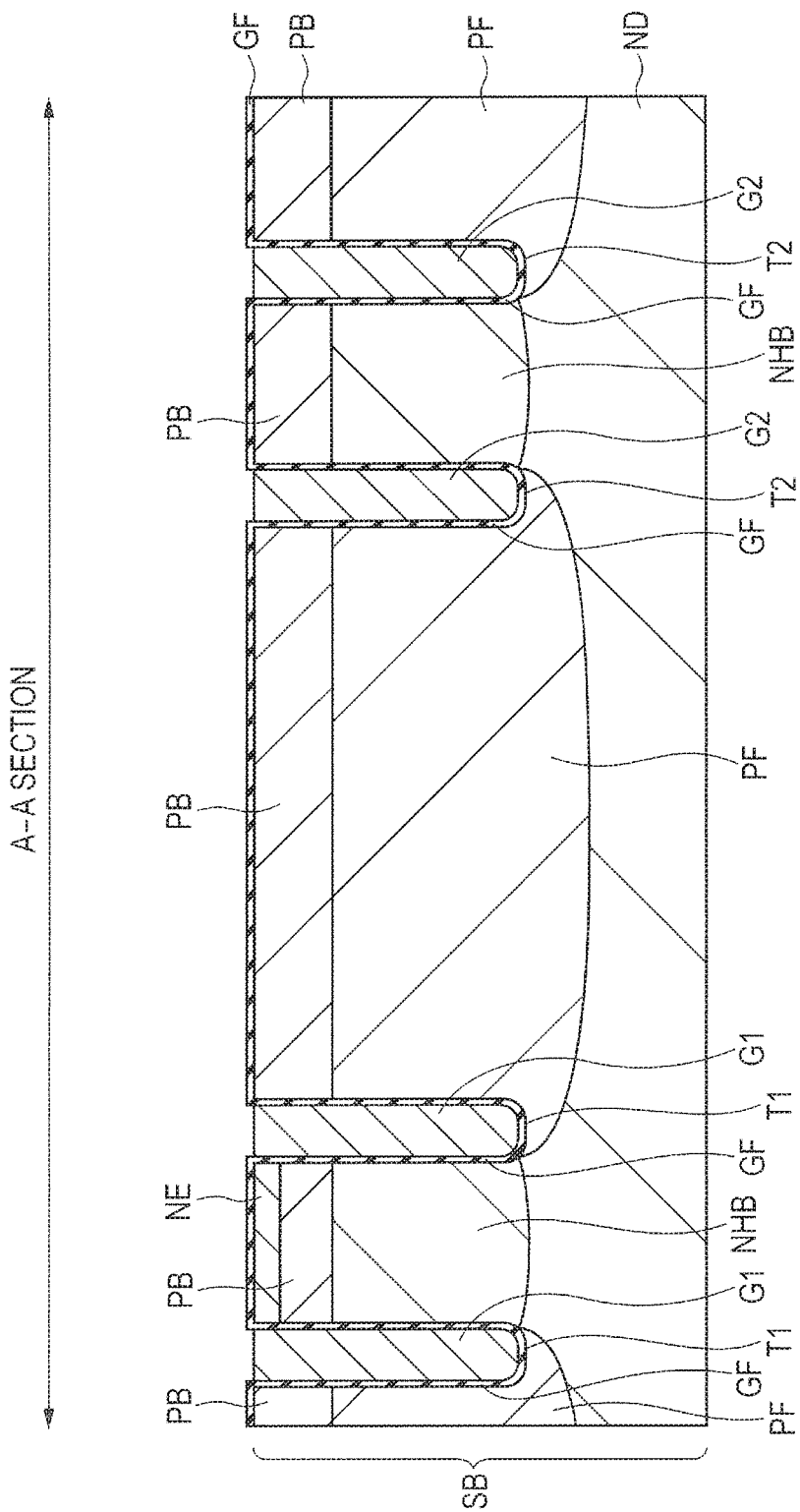
FIG. 11 is a sectional diagram showing a manufacturing process of the semiconductor device according to the embodiment 1.

FIG. 11 shows a process of forming a base region PB and an emitter region NE.

First, the photolithography method and the ion implantation method are used to form a p-type base region PB at the surface of each of the floating region PF and the hole barrier region NHB. The base region PB is an impurity region having an impurity concentration higher than that of the floating region PF.

Next, the photolithography method and the ion implantation method are used to form an n-type emitter region NE in the surface of the base region PB in an active cell area AC. The emitter region NE is an impurity region having an impurity concentration higher than that of the hole barrier region NHB. At this time, no emitter region NE is formed in the base region PB of each hole discharge cell area HEC.

Figure 12:
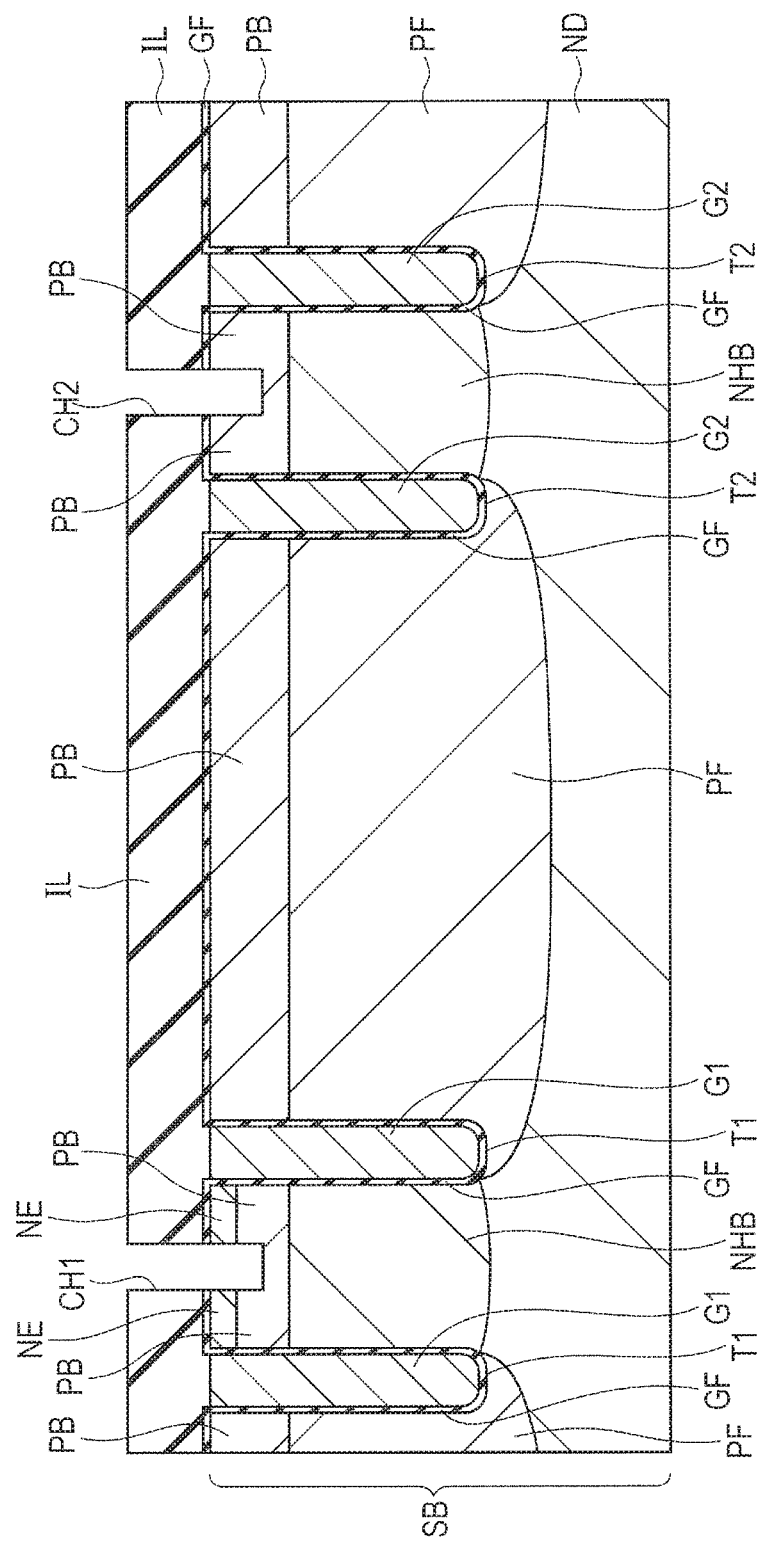
FIG. 12 is a sectional diagram showing a manufacturing process of the semiconductor device according to the embodiment 1.

FIG. 12 shows a process of forming an interlayer insulating film IL and contact holes CH1 through CH3.

First, an interlayer insulating film IL comprised of, for example, a silicon oxide film is formed over the gate electrodes G1, the gate electrodes G2, and the gate insulating film GF formed outside the trenches T1 and T2 by using a CVD method, for example. Next, the photolithography method and the dry etching are used to form a contact hole CH1 in the interlayer insulating film IL and gate insulating film GF in the active cell area AC and form a contact hole CH2 in the interlayer insulating film IL and gate insulating film GF in the hole discharge cell area HEC. The bottom of each of the contact holes CH1 and CH2 is formed to penetrate a part of the semiconductor substrate SB and reach the base region PB. That is, the contact hole CH1 is formed to be in contact with the emitter regions NE and the base regions PB in the active cell area AC. The contact hole CH2 is formed to be in contact with the base region PB in the hole discharge cell area HEC.

Figure 13:
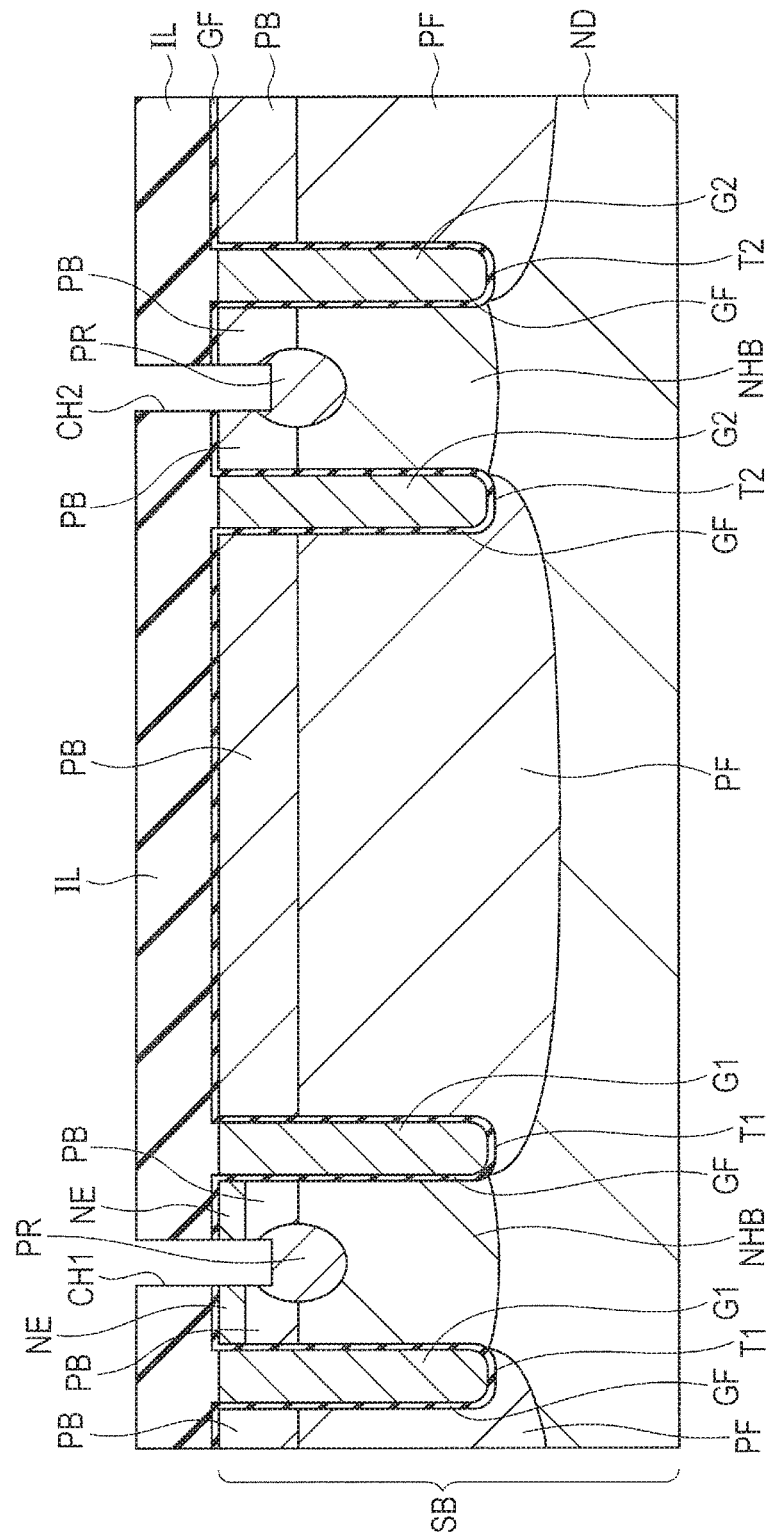
FIG. 13 is a sectional diagram showing a manufacturing process of the semiconductor device according to the embodiment 1.

FIG. 13 shows a process of forming a body region PR.

Following the above process of forming the contact holes CH1 and CH2, a p-type body region PR is formed at the bottom of each of the contact holes CH1 and CH2 by using the ion implantation method. The body region PR is an impurity region having an impurity concentration higher than that of the base region PB and is formed to straddle the base region PB and the hole barrier region NHB. Further, the body region PR in the active cell area AC is formed so as not to be in contact with the n-type emitter regions NE. Thereafter, heat treatment for activating each impurity region is carried out.

Although not illustrated in detail herein, a process of forming a contact hole CH3 is performed after the forming process of the body region PR. For example, by using the photolithography method and the dry etching, such a contact hole CH3 reaching the gate electrode G2 as shown in the B-B section of FIG. 4 is formed in the interlayer insulating film IL of the hole discharge cell area HEC. Incidentally, although not shown in the drawing, a contact hole which reaches the gate electrode G1 is also formed simultaneously.

Figure 14:
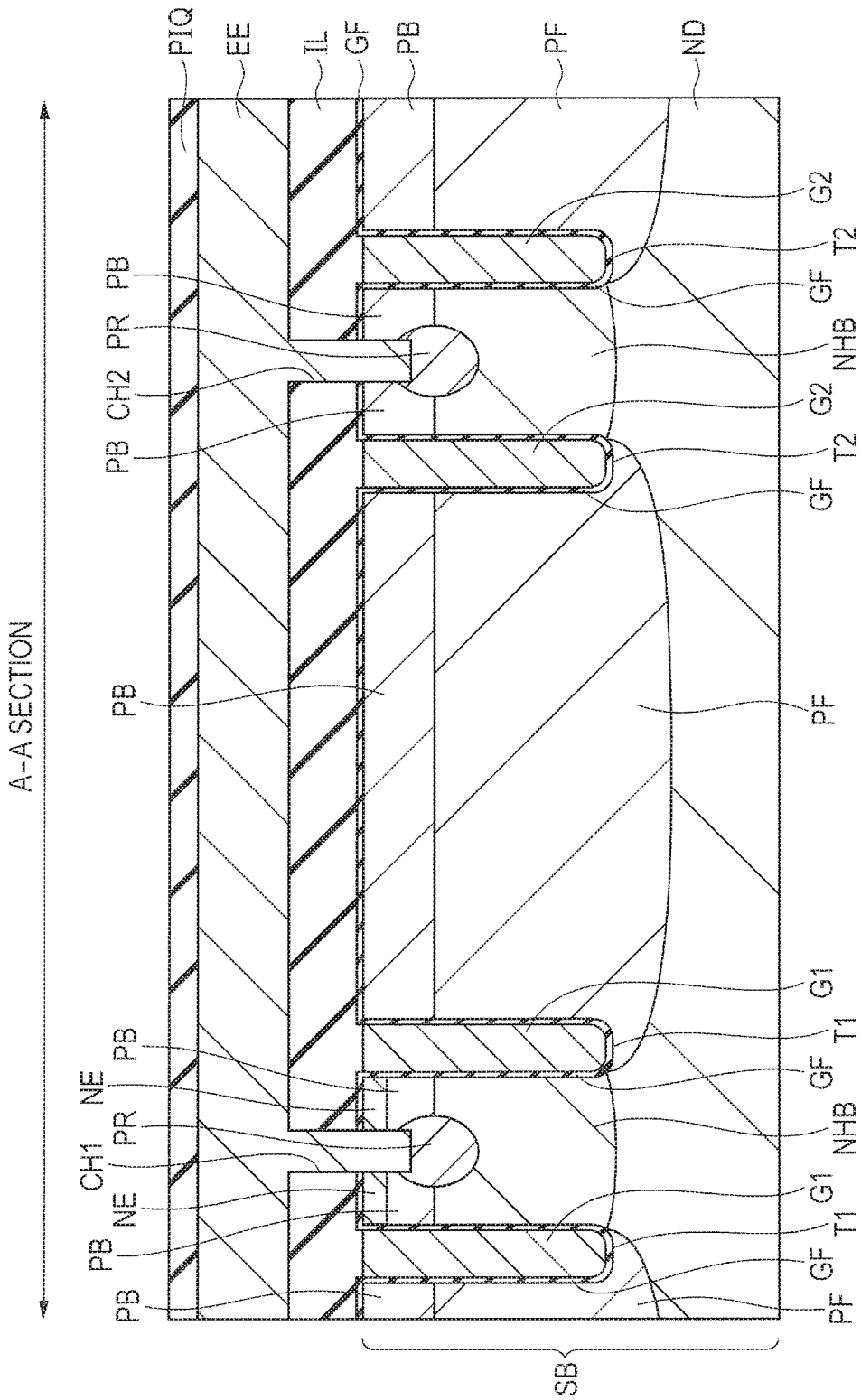
FIG. 14 is a sectional diagram showing a manufacturing process of the semiconductor device according to the embodiment 1.

FIG. 14 shows a process of forming an emitter potential electrode EE and a protective film PIQ.

First, for example, an aluminum film is formed over the interlayer insulating film IL so as to fill the contact holes CH1 and CH2 by using, for example, a sputtering method. Thereafter, the aluminum film is patterned using the photolithography method and the dry etching to form an emitter potential electrode EE. At this time, the emitter potential electrode EE is formed even within the contact hole CH3 shown in FIG. 4. Further, the gate potential electrode GE shown in FIG. 1 is also formed by pattering the above aluminum film.

Further, before the formation of the above aluminum film, a barrier metal film comprised of, for example, a titanium nitride film is formed, and the above aluminum film may be formed over the barrier metal film. That is, the emitter potential electrode EE and the gate potential electrode GE may be formed as a laminated film of the barrier metal film and the aluminum film. Incidentally, the illustration of the barrier metal film is omitted in the present embodiment.

Next, a protective film PIQ comprised of, for example, a resin such as polyimide or the like is formed so as to cover the emitter potential electrode EE and the gate potential electrode GE by using an application method, for example. Thereafter, the photolithography method and the dry etching are used to form openings in parts of the protective film PIQ, thereby exposing a part of the emitter potential electrode EE and a part of the gate potential electrode GE through the openings. The so-exposed regions serve as the emitter pad EP and gate pad GP shown in FIG. 1.

Thereafter, a field stop region NS, a collector region PC, and a collector potential electrode CE are formed on the back surface side of the semiconductor substrate SB.

First, polishing treatment is applied to the back surface of the semiconductor substrate SB to thin the thickness of the semiconductor substrate SB. Next, ion implantation is performed from the back surface side of the semiconductor substrate SB. The ion implantation is carried out by using the photolithography method and the dry etching, so that an n-type field stop region NS and a p-type collector region PC are formed. The field stop region NS is an impurity region having an impurity concentration higher than that of the drift region ND.

Next, a collector potential electrode CE comprised of, for example, a metal film such as a titanium nitride film or the like is formed at the surface of the collector region PC, which is exposed on the back surface side of the semiconductor substrate SB, by using the sputtering method or the CVD method, for example.

Thus, the semiconductor device according to the present embodiment shown in FIG. 3 is manufactured.

<Description of Examination Example>

A semiconductor device according to an examination example examined by the inventors of the present application will be described below using FIGS. 24 through 29.

Figure 24:
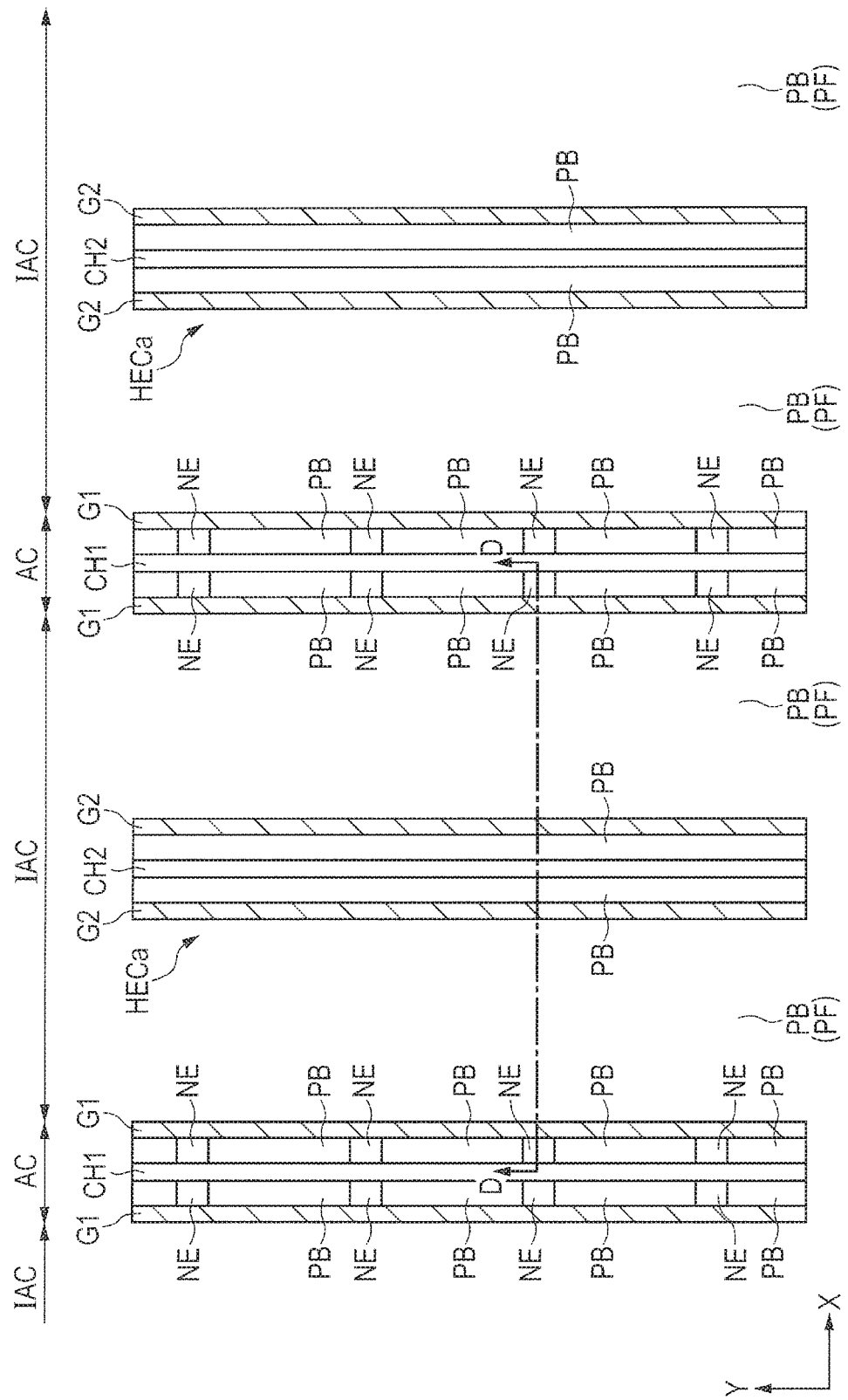
FIG. 24 is a fragmentary plan diagram of a semiconductor device according to an examination example.

FIG. 24 is a plan diagram of the semiconductor device according to the examination example and a plan diagram corresponding to FIG. 2 of the present embodiment. The semiconductor device according to the examination example is equipped with an IE type IGBT having a GGEE type structure. Incidentally, for the problem that the displacement current is generated through the gate electrode due to a fluctuation in the potential of the floating region PF in the GG type structure and the GGEE type structure, refer to the above-described Patent Document 3.

In the examination example, as distinct from the present embodiment, a gate electrode G2 coupled to an emitter potential is continuously formed in a Y direction, and a hole discharge cell area HECa in an inactive cell area IAC is continuously formed in the Y direction.

As a first objective of the examination example, the IE type IGBT having the GGEE type structure is capable of suppressing the fluctuation in the potential in the floating region PF as compared with the IE type IGBT having the GG type structure, but is accompanied by a problem that the input capacitance Cies becomes large. A problem arises in that when the input capacitance Cies increases, a trend of reducing di/dt and dv/dt becomes large, and the switching loss of the IGBT is easy to get worse. This problem will be described below using FIG. 25.

Figure 25:
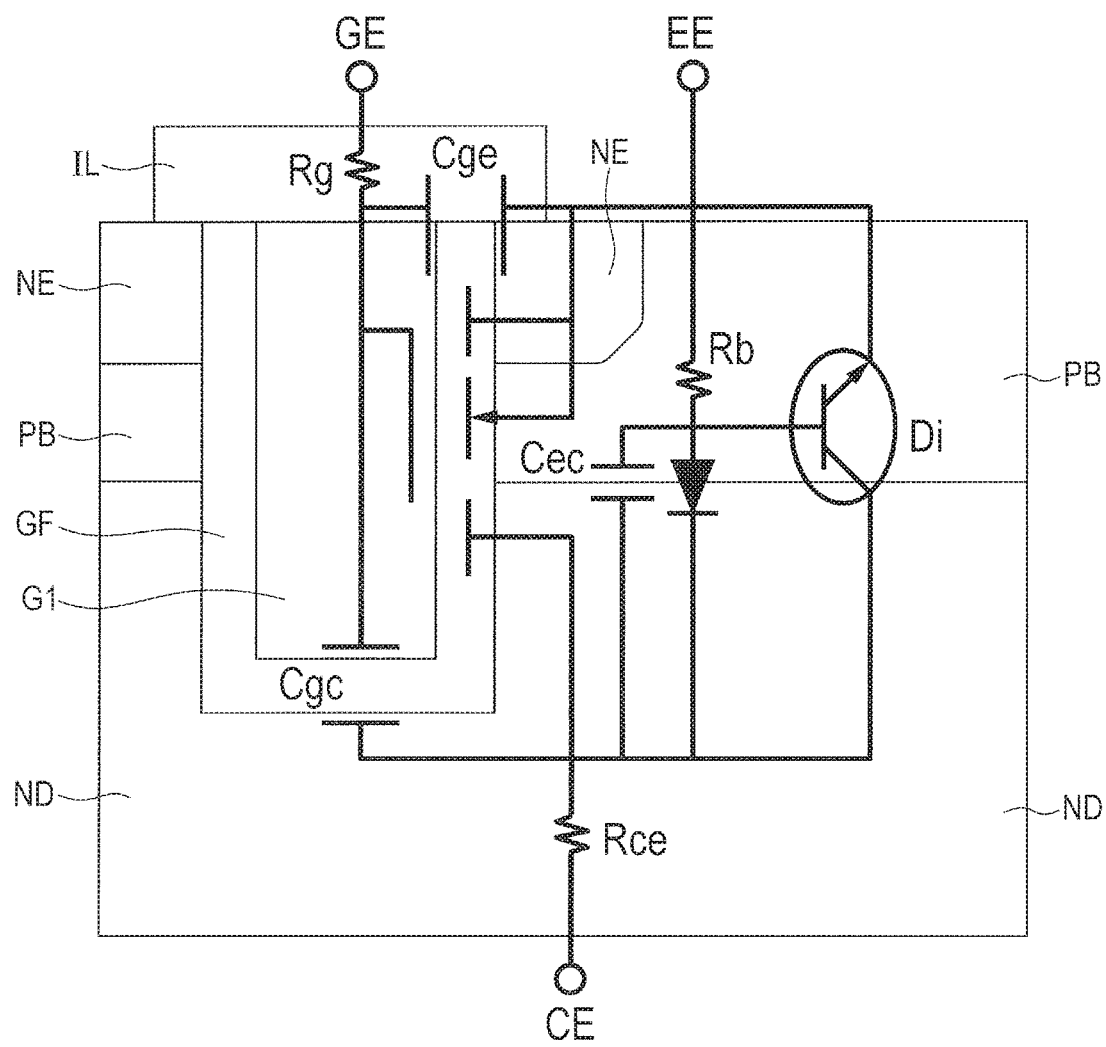
FIG. 25 is a typical diagram for describing a capacitive component and a resistive component at the time of the operation of an IGBT.

FIG. 25 is a typical diagram for describing capacitive and resistive components at the time of the operation of the IGBT and also shows an equivalent circuit. Incidentally, although FIG. 25 is a sectional diagram, hatching is omitted for clarity of description.

As shown in FIG. 25, the IGBT can be represented by an equivalent circuit using a collector potential electrode CE, an emitter potential electrode EE, a gate potential electrode GE, capacitances Cgc, Cec and Cge, a resistance Rg of the gate potential electrode GE, a resistance Rce between the collector potential electrode CE and the emitter potential electrode EE, a resistance Rb of a base region PB, and a body diode Di.

Here, the input capacitance Cies of the IGBT is comprised of Cge, Cgc and Cec and represented using the following equation (1).

Cies=Cge+Cgc·Cec/(Cgc+Cec)    (1)

It is understood from the equation (1) that an increase in the input capacitance Cies is greatly affected by an increase in the capacitance Cge.

Figure 26:
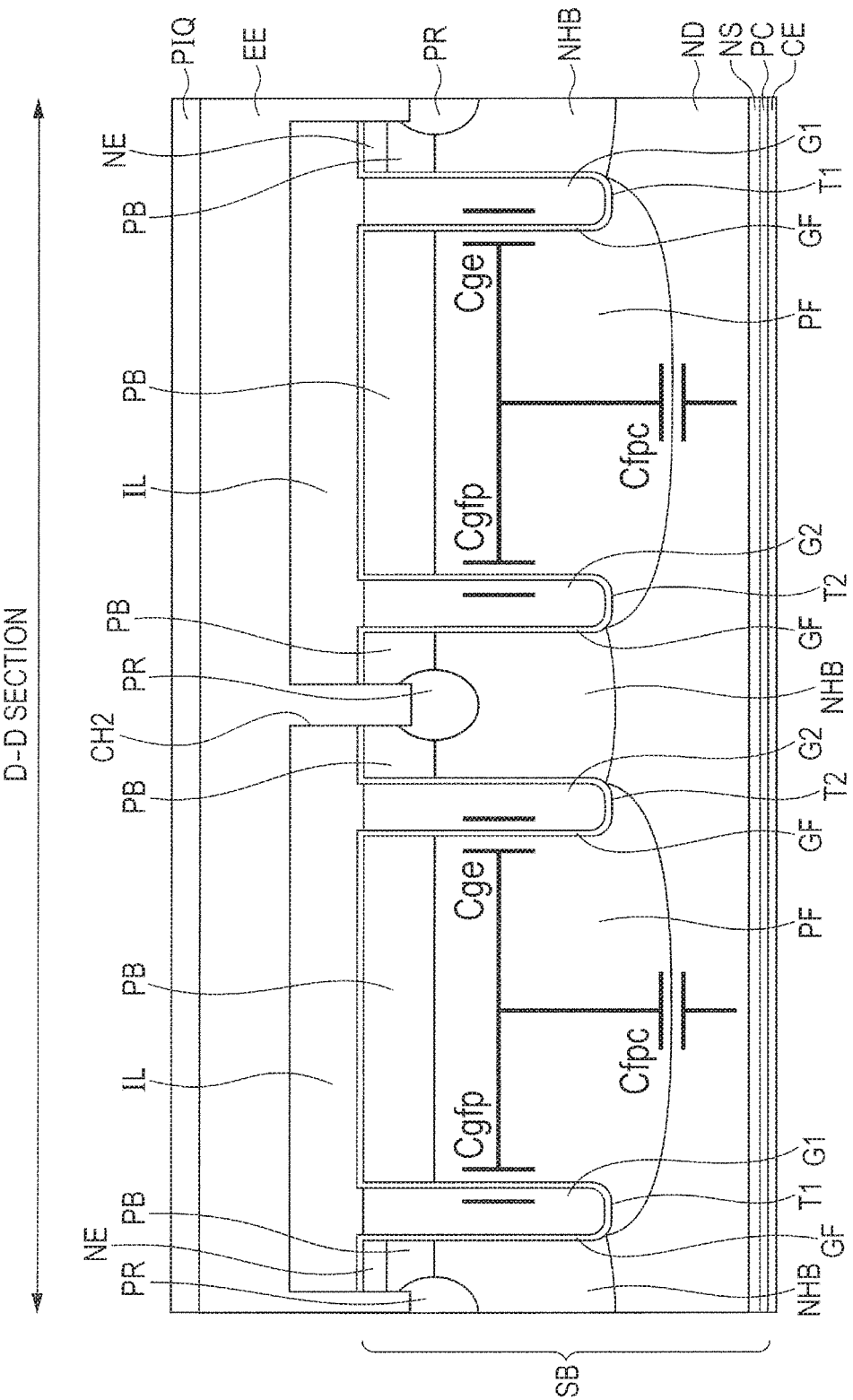
FIG. 26 is an explanatory diagram for indicating a part of a capacitive component at the time of the operation of an IGBT according to an examination example.

FIG. 26 is a sectional diagram taken along line D-D of FIG. 24 and an explanatory diagram for showing a part of a capacitive component at the time of the operation of the IGBT. Incidentally, although FIG. 26 is the sectional diagram, hatching is omitted for clarity of description.

In the GGEE type structure as shown in FIG. 26, a gate electrode G2 coupled to the emitter potential electrode EE and a gate electrode G1 coupled to the gate potential electrode GE are provided opposite to each other with a floating region PF interposed therebetween. Here, a feedback capacitance Cres is comprised of a capacitance Cfpc between the floating region PF and the collector potential electrode CE, and a capacitance Cgfp between the gate potential electrode GE and the floating region PF, whereas a capacitance Cge between the gate potential electrode GE and the emitter potential electrode EE is added to the input capacitance Cies. Since the gate electrode G2 coupled to the emitter potential electrode EE does not exist in the GG type structure, the above capacitance Cge is not generated. Thus, in the GGEE type structure, the input capacitance Cies is increased with the addition of the capacitance Cge.

Thus, the first objective is to suppress the increase in the input capacitance Cies.

Next, as a second objective of the examination example, there is a problem that holes discharged from the hole discharge cell area HECa becomes too large in number with the use of a parasitic p-type MOSFET1, so that an IE effect is reduced and a switching loss is deteriorated. This problem will be described below using FIGS. 27 and 28.

Figure 27:
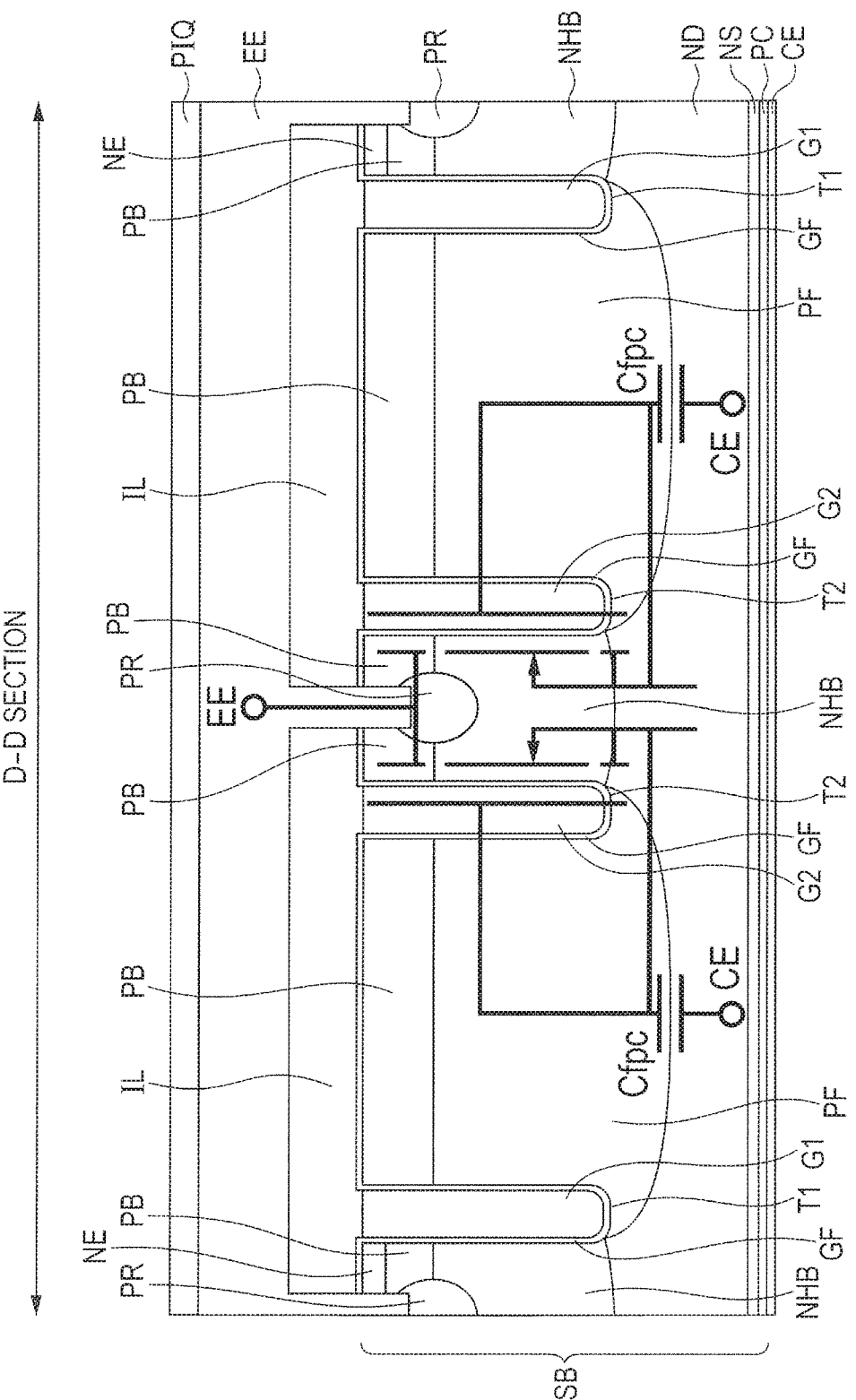
FIG. 27 is an explanatory diagram for indicating a parasitic p-type MOSFET at the time of the operation of the IGBT according to the examination example.
Figure 28:
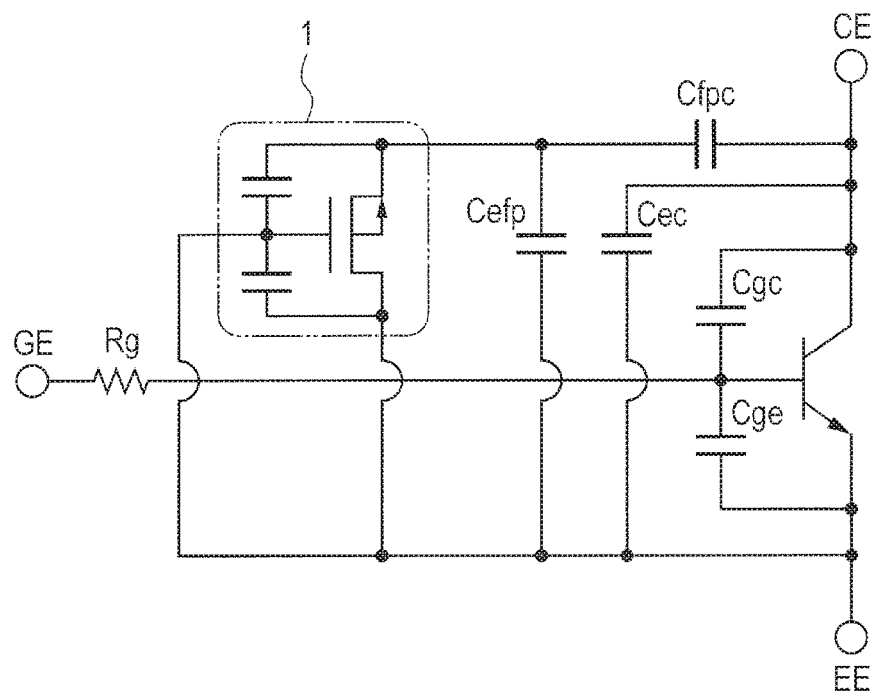
FIG. 28 is an equivalent circuit diagram of the entire IGBT shown in FIG. 27.

FIG. 27 shows a sectional diagram taken along line D-D of FIG. 24 and is an explanatory diagram showing the parasitic p-type MOSFET1 at the time of the operation of the IGBT. Incidentally, although FIG. 27 is a sectional diagram, hatching is omitted for clarity of description. FIG. 28 is an equivalent circuit diagram of the entire IGBT shown in FIG. 27.

As shown in FIG. 28, the IGBT of FIG. 27 can be represented by an equivalent circuit using a collector potential electrode CE, an emitter potential electrode EE, a gate potential electrode GE, capacitances Cgc, Cge, Cec, Cfpc and Cefp, and the parasitic p-type MOSFET1.

The hole discharge cell area HECa is provided to originally form the parasitic p-type MOSFET1 shown in FIG. 27. The parasitic p-type MOSFET1 is operated by making a positive hole current flow through a current path extending from an n-type drift region ND and further passing the portion near the bottom of a trench T2, of a p-type floating region PF, an n-type hole barrier region NHB, and a p-type base region PB. That is, the parasitic p-type MOSFET1 is configured to have the gate electrode G2 coupled to the emitter potential electrode EE as a gate, the p-type floating region PF as a source, the p-type base region PB as a drain, and the n-type hole barrier region NHB as a channel. Thus, upon the turn on of the IGBT, holes existing in the vicinity of the bottom of the trench T2 are discharged as carriers. Accordingly, it is possible to suppress a potential fluctuation in the floating region PF.

A problem however arises in that when the holes are extremely discharged in large quantities, an IE effect becomes weak and a switching loss at the turn on is increased.

Thus, the second objective is to adequately adjust the discharge of the holes and prevent the IE effect from being excessively deteriorated.

Next, as a third objective of the examination example, there is a problem that an off-surge voltage in a load short-circuit test is large. This problem will be described below using FIG. 29.

Figure 29:
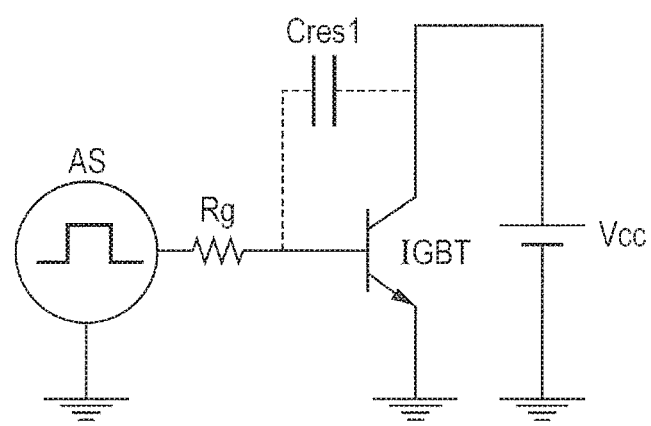
FIG. 29 is a circuit diagram used during a load short-circuit test.

FIG. 29 is a circuit diagram used during the load short-circuit test. The collector side of the IGBT is coupled to a power supply voltage Vcc being a collector potential, and an AC signal source AS is coupled to the gate side of the IGBT through a resistor Rg.

The load short-circuit test is a test which is performed by keeping the gate in an on state for a predetermined period in a state in which the power supply voltage Vcc is applied, thereby making a current flow, and thereafter confirms causing no element breakage until a protection circuit (not shown) protects the IGBT after the power supply voltage Vcc is cut off. Here, when the gate is turned off, a counter electromotive voltage (off-surge voltage) may be generated with a change in current. Further, there is a problem that the element breakage occurs when the off-surge voltage becomes equal to or more than a rated voltage.

The inventors of the present application have confirmed that the off-surge voltage is reduced by attaching an external capacitance Cres1 indicated by a broken line in FIG. 29 to the IGBT. The external capacitance Cres1 is equivalent to the feedback capacitance Cres. That is, the inventors of the present application have confirmed that the off-surge voltage is reduced when the feedback capacitance Cres is large. Further, the inventors of the present application also have confirmed that an increase or decrease in the input capacitance Cies does not particularly depend on the off-surge voltage.

Here, the feedback capacitance Cres has a relationship of being equal to the capacitance Cgc. As described above, although the input capacitance Cies is increased when the capacitance Cge is increased, the capacitance Cge is sufficiently larger than the capacitance Cgc. Therefore, since an increase in the feedback capacitance Cres (capacitance Cgc) almost unaffects the input capacitance Cies, the switching loss is not deteriorated.

That is, the third objective is to make the feedback capacitance Cres of the IGBT large and reduce the off-surge voltage.

<Major Features and Effects of Semiconductor Device According to the Present Embodiment>

Major features and effects of the semiconductor device according to the present embodiment will hereinafter be described using FIGS. 15 through 17, etc. in comparison with the above-described examination example.

The features of the present embodiment with respect to the first and second objectives shown in the examination example will first be described below.

The hole discharge cell area HECa in the examination example has been continuously formed in the Y direction as in the active cell area AC as illustrated in FIG. 24.

On the other hand, in the present embodiment, as shown in FIG. 2, the hole discharge cell areas HEC have not been continuously formed in the Y direction as in the active cell area AC and have been separated into the plural cells in the Y direction. Therefore, the facing area between the active cell area AC and the hole discharge cell area HEC adjacent to each other in the X direction is reduced. That is, as compared with the case where the hole discharge cell area HEC in the inactive cell area IAC is continuously formed in the Y direction as in the active cell area AC, the facing area between the gate electrodes G1 and G2 adjacent to each other in the X direction is reduced. Thus, it is possible to reduce the input capacitance Cies.

Further, when the width of the hole discharge cell area HEC in the X direction is made excessively small, the effect of suppressing the potential fluctuation in the floating region PF is reduced. Therefore, it is desirable that the width of the hole discharge cell area HEC is the same as or larger than the width of the active cell area AC in the X direction. In other words, it is desirable that the X-direction width of the ring-shaped gate electrode G2 is greater than the distance between the two gate electrodes G1 adjacent to each other in the X direction.

As described in FIGS. 26 and 27 and the equation (1) in the examination example, the input capacitance Cies is greatly affected by the increase or decrease in the capacitance Cge between the gate electrodes G1 and G2. Therefore, as in the present embodiment, the reduction in the facing area between the gate electrodes G1 and G2 adjacent in the X direction means that the capacitance Cge is reduced, and the input capacitance Cies is reduced. Therefore, in the present embodiment, the reductions in di/dt and dv/dt are suppressed, and the switching loss at the turn on of the IGBT is improved. Further, the switching loss at the turn off thereof is not adversely affected.

Figure 15:
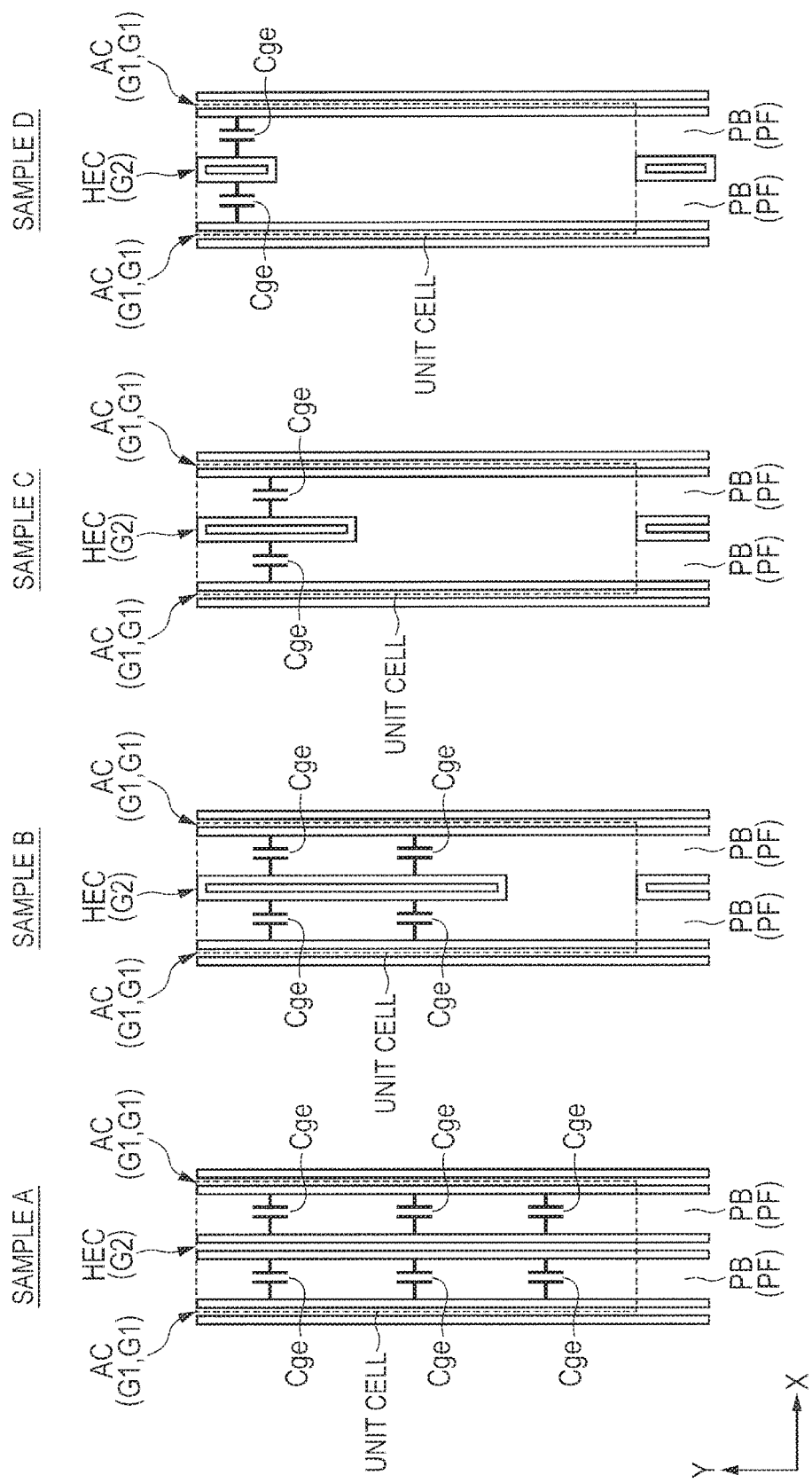
FIG. 15 is a fragmentary plan diagram of a semiconductor device used in experiment by the inventors of the present application.

FIG. 15 shows a plan diagram of samples (semiconductor devices) A through D used in the experiment when the inventors of the present application devise the semiconductor device according to the present embodiment. The samples A through D are different in terms of the occupation ratio of each hole discharge cell area HEC. The sample A is equivalent to the structure of the above-described examination example, and each of the samples B through D is equivalent to the structure of the present embodiment. That is, the samples B through D are structures in which hole discharge cell areas HEC are divided into plural form in a Y direction. Each hole discharge cell area HEC has a ring-shaped gate electrode G2. When the occupation ratios of the hole discharge cell areas HEC in the samples B through D are compared with each other, the occupation ratio of the sample B is the largest, and the occupation ratio of the sample C is secondly large. The occupation ratio of the sample D is the smallest.

Also, for simplification of description, FIG. 15 illustrates gate electrodes G1 extending in the Y direction in each active cell area AC, and a gate electrode G2 in each hole discharge cell area HEC.

Further, the term "occupation ratio of hole discharge cell area HEC" described herein is a ratio between the areas of the active cell area AC and the hole discharge cell area HEC opposed to each other in an X direction, and a ratio between the areas of the two gate electrodes G1 and the gate electrode G2 both opposed to each other in the X direction. In FIG. 15, a unit cell is indicated by a broken line. The occupation ratio of each sample per unit cell is 100% in the sample A, about 66% in the sample B, about 33% in the sample C, and about 16% in the sample D.

Further, when the width of each active cell area AC is W1, the width of each floating region PF is W4, the width of each hole discharge cell area HEC is W3, and the width of each floating region PF is W5 in the X direction in the samples A through D as with the semiconductor device according to the present embodiment, W1:W4:W3:W5 is within a range from 1:2:1:2 to 1:4:1:4. Further, it is most preferable that W1:W4:W3:W5 is 1:3:1:3.

Figure 30:
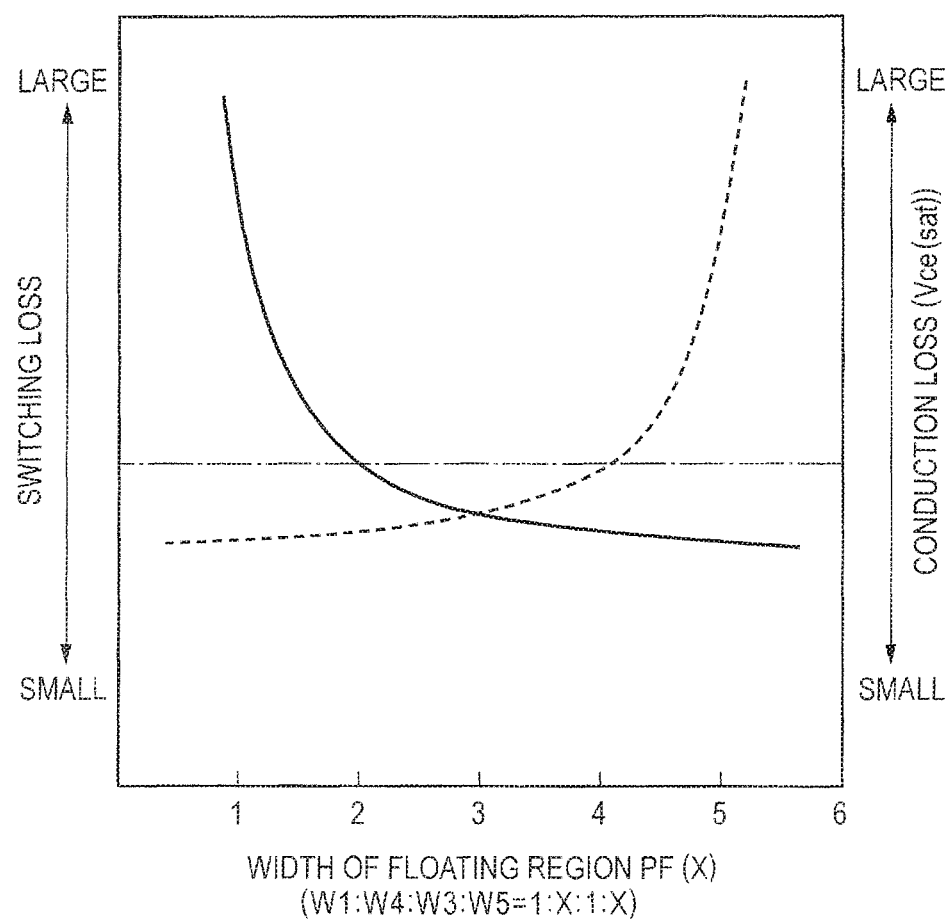
FIG. 30 is a graph showing the relationship between the width of a floating region and a switching loss or a conduction loss.

FIG. 30 is a result of simulation performed by the inventors of the present application and a graph showing the relationship between the width (W4, W5) of the floating region PF and the switching loss or conduction loss at the turn off. The horizontal axis of the graph indicates a value X of each of W4 and W5 where the value of each of W1 and W3 is taken as 1. The vertical axis of the graph indicates the magnitudes of the switching loss and the conduction loss. In the graph, a solid line indicates the conduction loss, and a broken line indicates the switching loss at the turn off. Further, a one-dot chain line parallel to the horizontal axis is a reference line indicating satisfying the specifications of a product. Incidentally, an increase in each of the switching loss and conduction loss at the turn off means that the switching loss and conduction loss at the turn off are deteriorated. Incidentally, the deterioration in the conduction loss means that a forward saturation voltage Vce (sat) becomes high.

It is understood from the graph of FIG. 30 that the switching loss at the turnoff is improved as the width of the floating region PF becomes smaller, and the conduction loss is improved as the width of the floating region PF becomes larger. Therefore, when an attempt is made to improve both the switching loss and the conduction loss at the turn off, it is understood that the widths W4 and W5 of the floating region PF preferably fall within a range from 2 to 4. That is, it is preferable that W1:W4:W3:W5 is within a range from 1:2:1:2 to 1:4:1:4.

Further, in the samples A through D, the width of the unit cell in the Y direction was measured as about 60 μm, and the width (width of floating region PF) between the active cell area AC and the hole discharge cell area HEC in the X direction was measured as 10 μm.

It is understood that as shown in FIG. 15, the capacitance Cge configured by the gate electrode G1 and the gate electrode G2 becomes small as the occupation ratio of the hole discharge cell area HEC is made smaller. As described in FIG. 27 of the above-described examination example, the capacitance Cge is added as the input capacitance Cies. A reduction in the capacitance Cge means that the input capacitance Cies is reduced.

Figure 16:
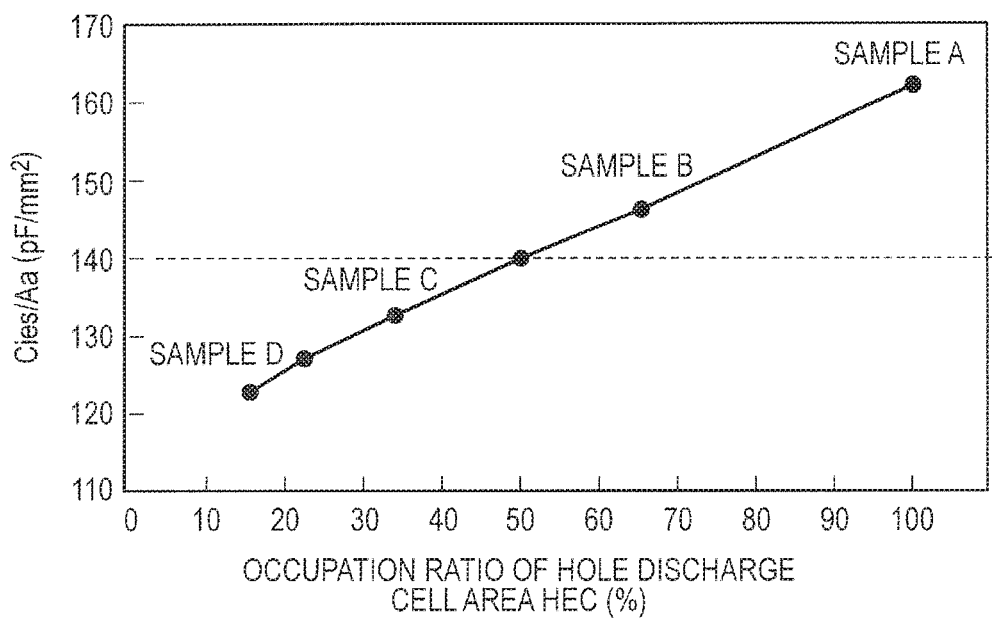
FIG. 16 is a graph showing the relationship between an input capacitance and an occupation ratio of a hole discharge cell area.

FIG. 16 is a graph showing the relationship between the input capacitance Cies and the occupation ratio of the hole discharge cell area HEC and a graph in which the above samples A through D are compared. The vertical axis of FIG. 16 indicates a value (Cies/Aa) of the input capacitance Cies with respect to an area Aa per unit cell in the active cell area AC. The horizontal axis of FIG. 16 indicates the occupation ratio of the hole discharge cell area HEC. Incidentally, in FIG. 16, samples other than the above samples A through D have been measured. Measured values of other samples are also shown as reference in the graph. Further, the operation environment of the IGBT in the measurement is taken to be a frequency f=1 MHz, a collector voltage Vcc=25V, and a gate-emitter voltage Vge=0V.

It is understood that as shown in FIG. 16, Cies/Aa is reduced as the occupation ratio of the hole discharge cell area HEC becomes lower. Here, it is desired that Cies/Aa=140 pF/mm$^2$ or less as the performance required for the IGBT from the market. As understood from FIG. 16, Cies/Aa=140 pF/mm$^2$ or less can be achieved by setting the occupation ratio of the hole discharge cell area HEC to be 50% or less using the semiconductor device according to the present embodiment.

Next, a description will be made about the relationship between the distance (L1) between the active cell area AC and the hole discharge cell area HEC adjacent in the X direction, which are shown in FIGS. 2 through 4, and the distance (L2) between the two hole discharge cell areas HEC adjacent in the Y direction, which are shown in the same drawing.

It is desirable that in the present embodiment, the distance L2 is made larger than the distance L1 from the occupation ratio of the hole discharge cell area HEC of FIG. 15 and the graph of FIG. 16. It is preferable that in order to take Cies/Aa=140 pF/mm$^2$ or less in particular, L1:L2 is designed to fall within a range from 1:6 to 1:11. By designing the distance L1 and the distance L2 to be such a value, a potential fluctuation in the floating region PF can be appropriately suppressed, and the input capacitance Cies can be made large. It is therefore possible to suppress deterioration in the switching loss at the turn off due to a reduction in the IE effect. In the present embodiment, the switching loss at the turn on could be reduced 65% or more as compared with the above-described examination example.

Incidentally, the distance L1 is the shortest distance between the gate electrode G1 embedded in the trench T1 and the gate electrode G2 embedded in the trench T2 in the X direction. The distance L2 is the shortest distance between the two gate electrodes G2 adjacent to each other and each embedded in the trench T2 in the Y direction.

Next, the features of the present embodiment with respect to the third objective shown in the examination example will be described below.

Figure 17:
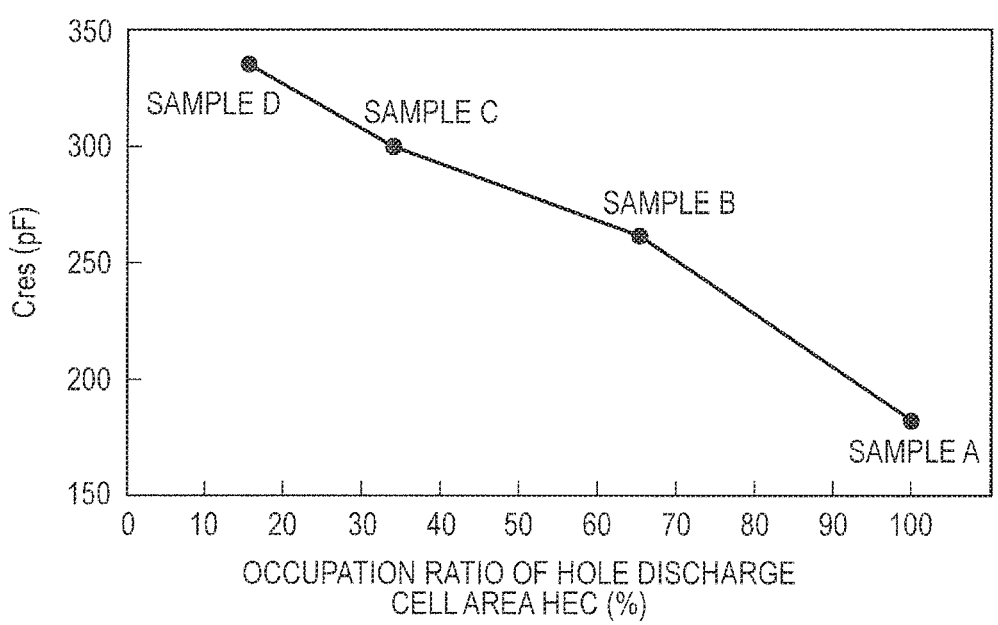
FIG. 17 is a graph showing the relationship between a feedback capacitance and an occupation ratio of a hole discharge cell area.

FIG. 17 is a graph showing the relationship between the feedback capacitance Cres and the occupation ratio of the hole discharge cell area HEC and a graph in which the above samples A through D are compared. The vertical axis of FIG. 17 indicates the value of the feedback capacitance Cres, and the horizontal axis of FIG. 17 indicates the occupation ratio of the hole discharge cell area HEC.

As understood from the graph of FIG. 17, it is understood that the feedback capacitance Cres is increased as the occupation ratio of the hole discharge cell area HEC decreases. As compared with such an examination example as described in FIG. 27 mentioned above, in the present embodiment, the capacitance Cge between the gate potential electrode GE and the emitter potential electrode EE is reduced with a reduction in the hole discharge cell area HEC, and the floating region PF is arranged in the reduced hole discharge cell area HEC. Thus, the feedback capacitance Cres is increased as the capacitance Cgfp between the gate potential electrode GE and the floating region PF increases. Accordingly, the semiconductor device according to the present embodiment is capable of reducing the off-surge voltage in the load short-circuit test with the increase in the feedback capacitance Cres.

Thus, it is understood that the performance of the semiconductor device is improved by applying the technology disclosed in the present embodiment.

Embodiment 2

A semiconductor device according to an embodiment 2 will be described below using FIGS. 18 through 21.

Figure 18:
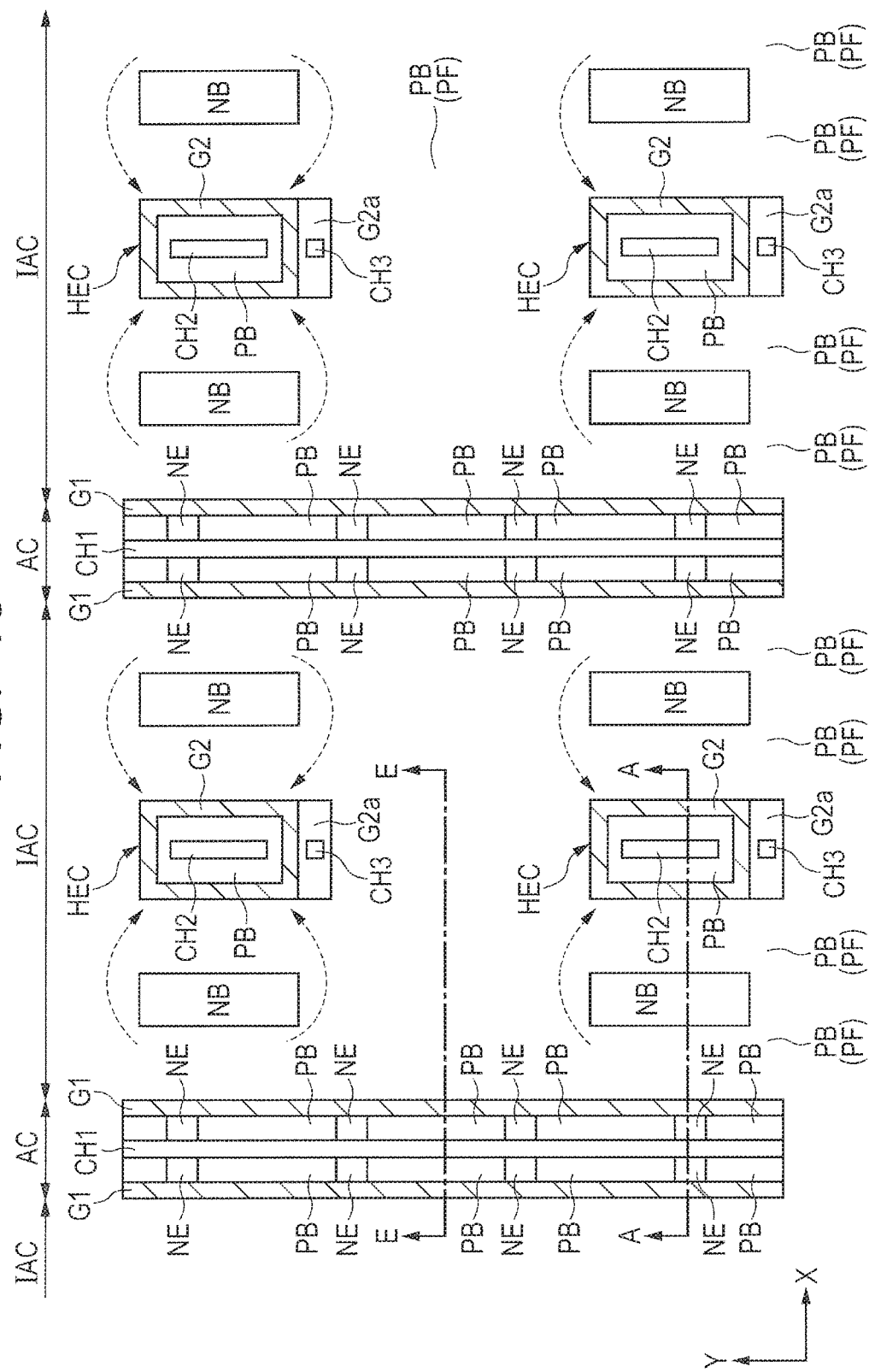
FIG. 18 is a fragmentary plan diagram of a semiconductor device according to an embodiment 2.
Figure 19:
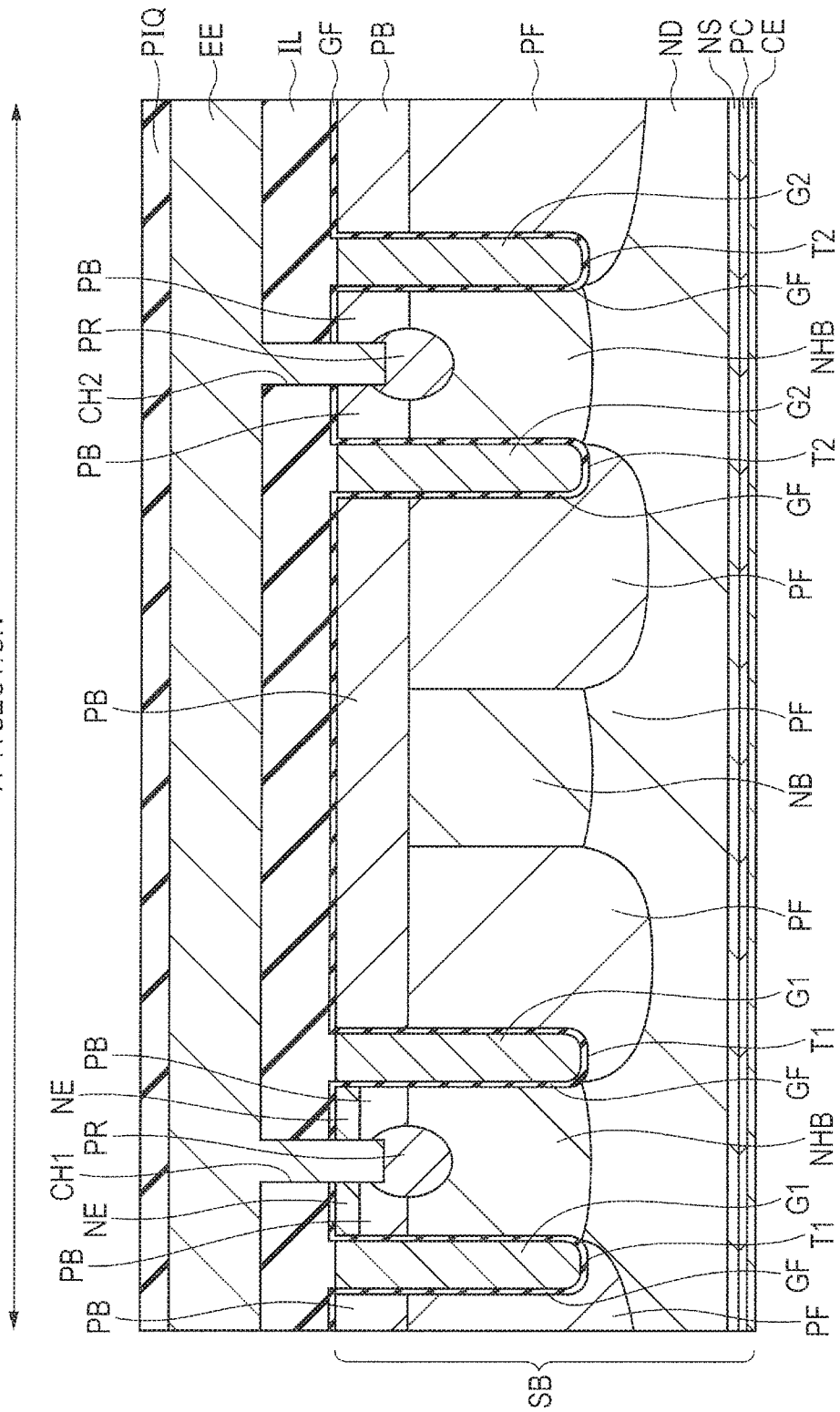
FIG. 19 is a sectional diagram of the semiconductor device according to the embodiment 2.
Figure 20:
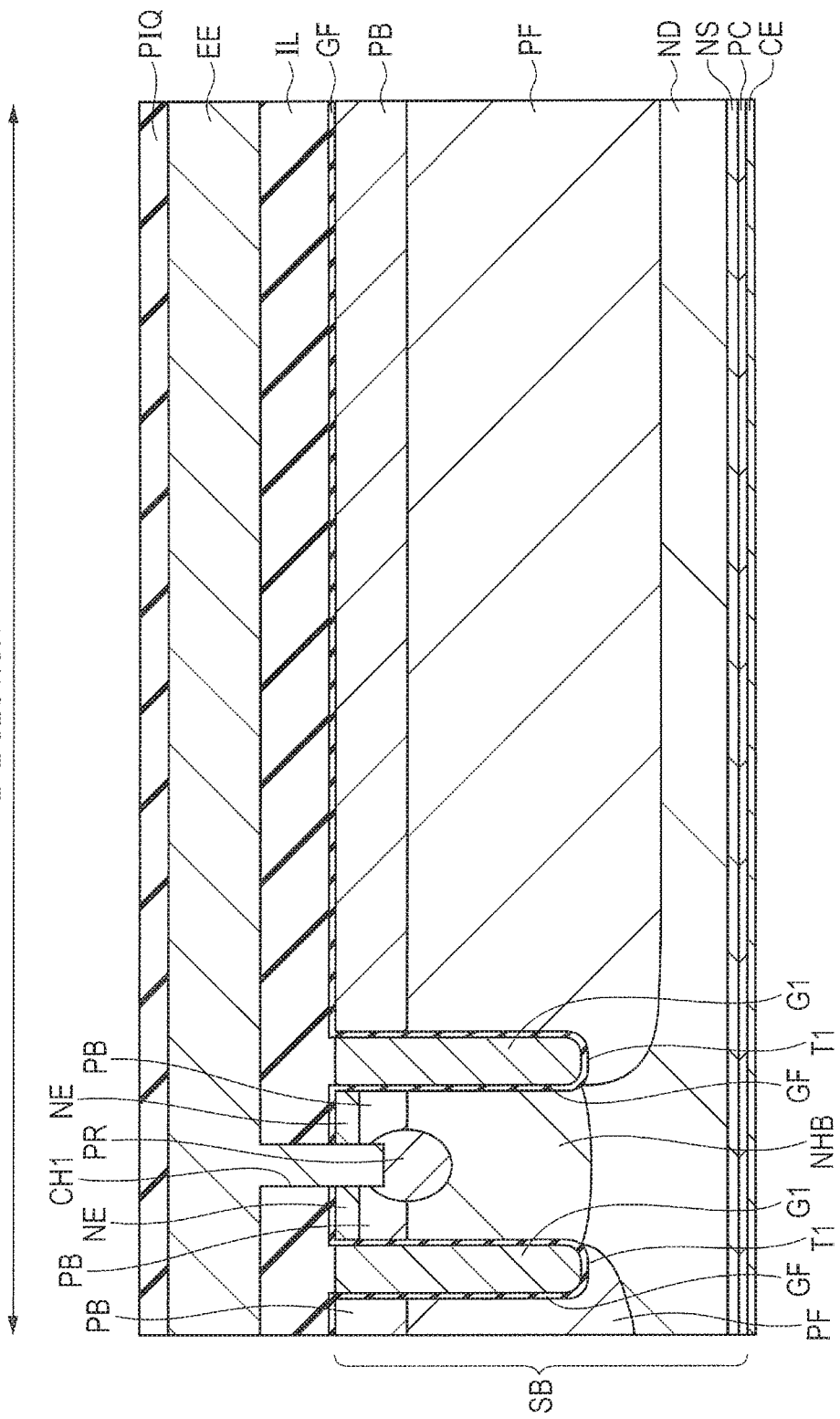
FIG. 20 is a sectional diagram of the semiconductor device according to the embodiment 2.

FIG. 18 is a fragmentary plan diagram of a semiconductor chip CHP and a plan diagram showing the same part as that in FIG. 2 of the embodiment 1. FIG. 19 is a sectional diagram taken along line A-A of FIG. 18, and FIG. 20 is a sectional diagram taken along line E-E of FIG. 18. Incidentally, since the sectional diagram of the embodiment 2 and the sectional diagram of the embodiment 1 are the same in terms of the B-B section shown in FIG. 4 of the embodiment 1, its description will be omitted.

In the embodiment 1, the floating region PF has been formed in the region other than each hole discharge cell area HEC in the inactive cell area IAC.

In the embodiment 2, as shown in FIGS. 18 and 19, n-type impurity regions NB are provided in a drift region ND so as to divide a floating region PF between an active cell area AC and a hole discharge cell area HEC. Each of the n-type impurity regions NB has an impurity concentration higher than that of the drift region ND and has an impurity concentration equal to or greater than that of a hole barrier region NHB.

Such impurity regions NB can be formed by performing an additional process using the photolithography method and the ion implantation method in the above process of FIG. 7.

As shown in FIG. 19, a base region PB is formed above the impurity region NB. Therefore, the floating regions PF divided by the impurity regions NB are electrically coupled through the base region PB in sectional view. However, the base region PB above the impurity region NB does not substantially contribute to be a hole discharge path.

Further, as shown in FIGS. 18 and 20, the impurity regions NB are not provided in the entire inactive cell area IAC, but provided in regions in each of which the active cell area AC and the hole discharge cell area HEC are opposed to each other in an X direction. Further, a region in which gate electrodes G1 and G2 are not opposed to each other serves as the floating region PF in the X direction. That is, each of the impurity regions NB is provided in a region in which the gate electrodes G1 and G2 are opposed to each other in the X direction, but is not provided in the region in which the gate electrodes G1 and G2 are not opposed to each other. In other words, the plural impurity regions NB are discontinuously provided within the floating region PF in a Y direction.

Therefore, the hole discharge path is mainly represented like each broken-line arrow in FIG. 18. That is, holes are mainly discharged from the hole discharge cell area HEC through a path turning around each impurity region NB in plan view.

Thus, the discharge efficiency of the holes in the embodiment 2 is degraded as compared with the embodiment 1. Further, depletion in each impurity region NB is promoted upon application of a collector voltage by forming each impurity region NB within the floating region PF. Therefore, a capacitance Cge between the gate electrodes G1 and G2 is reduced, so that an input capacitance Cies is decreased. Thus, as compared with the semiconductor device according to the embodiment 1, the semiconductor device according to the embodiment 2 is capable of suppressing a potential fluctuation in the floating region PF formed at the side surface of the gate electrode G1 and enhancing an IE effect, and further improving a switching loss at the turn on of an IGBT.

Figure 21:
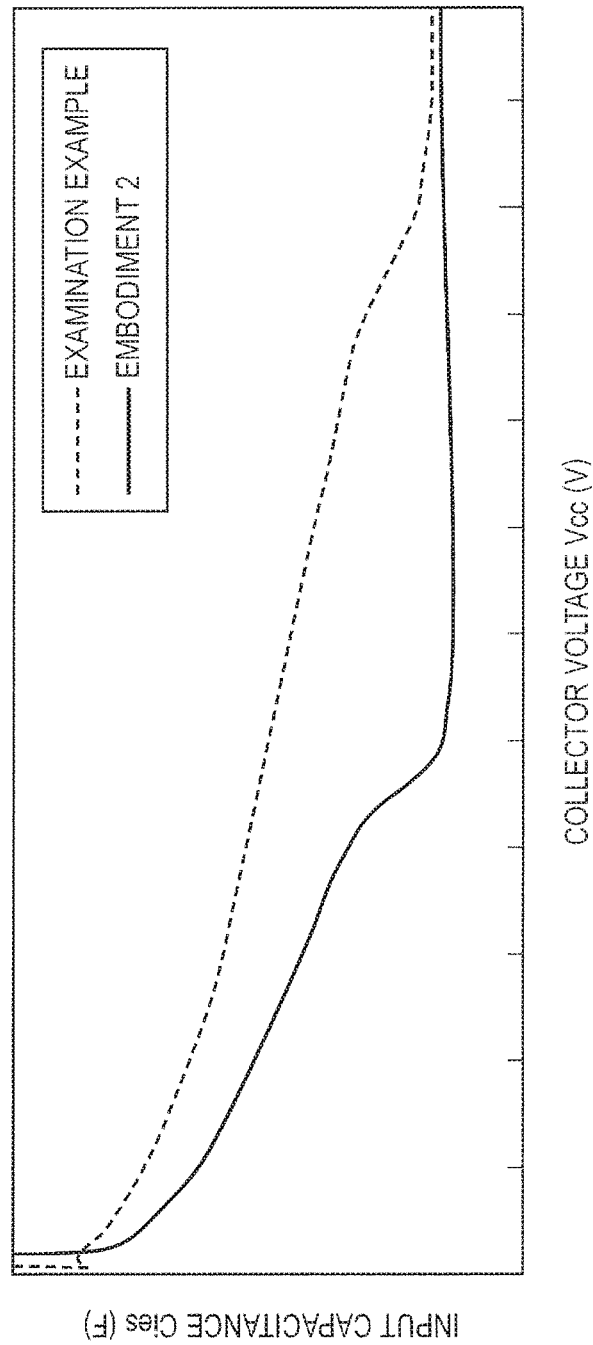
FIG. 21 is a graph showing the relationship between an input capacitance and a collector voltage.

FIG. 21 is a graph showing the relationship between the input capacitance Cies and the collector voltage Vcc and a graph in which the semiconductor device according to the embodiment 2 and the above-described examination example are compared. Incidentally, values shown in FIG. 21 are not actual measurement values but relative values. The horizontal axis of FIG. 21 indicates a change in the collector voltage Vcc and indicates that the voltage becomes large as it changes from left to right. The vertical axis of FIG. 21 indicates a change in the input capacitance Cies and indicates that the capacitance becomes large as it changes from bottom to top. In FIG. 21, a graph indicated by a broken line indicates the semiconductor device according to the above-described examination example, and a graph indicated by a solid line indicates the semiconductor device according to the embodiment 2. It is understood from these graphs that the semiconductor device according to the embodiment 2 reduces the input capacitance Cies more than in the semiconductor device according to the examination example.

Further, although each impurity region NB is provided according to the additional process in the embodiment 2, the impurity region NB can also be formed by the same process as the hole barrier region NHB where the impurity concentration of the hole barrier region NHB is sufficiently high. That is, the hole barrier region NHB may be provided within the floating region PF formed between the gate electrodes G1 and G2 in the X direction. In this case, since only the change of a mask may be performed, it is not necessary to perform the additional process as compared with the embodiment 1. It is therefore possible to suppress an increase in manufacturing cost.

Incidentally, the technology disclosed in the embodiment 2 may be applied to the semiconductor device according to the modification of the embodiment 1.

Embodiment 3

A semiconductor device according to an embodiment 3 will be described below using FIGS. 22 and 23.

A description will be made here about an example in which the semiconductor device according to the embodiment 3 is a module having a plurality of semiconductor chips each equipped with the embodiment 1, the modification of the embodiment 1 or the IGBT described in the embodiment 2 and in which the plural semiconductor chips CHP are coupled in parallel to each other.

Figure 22:
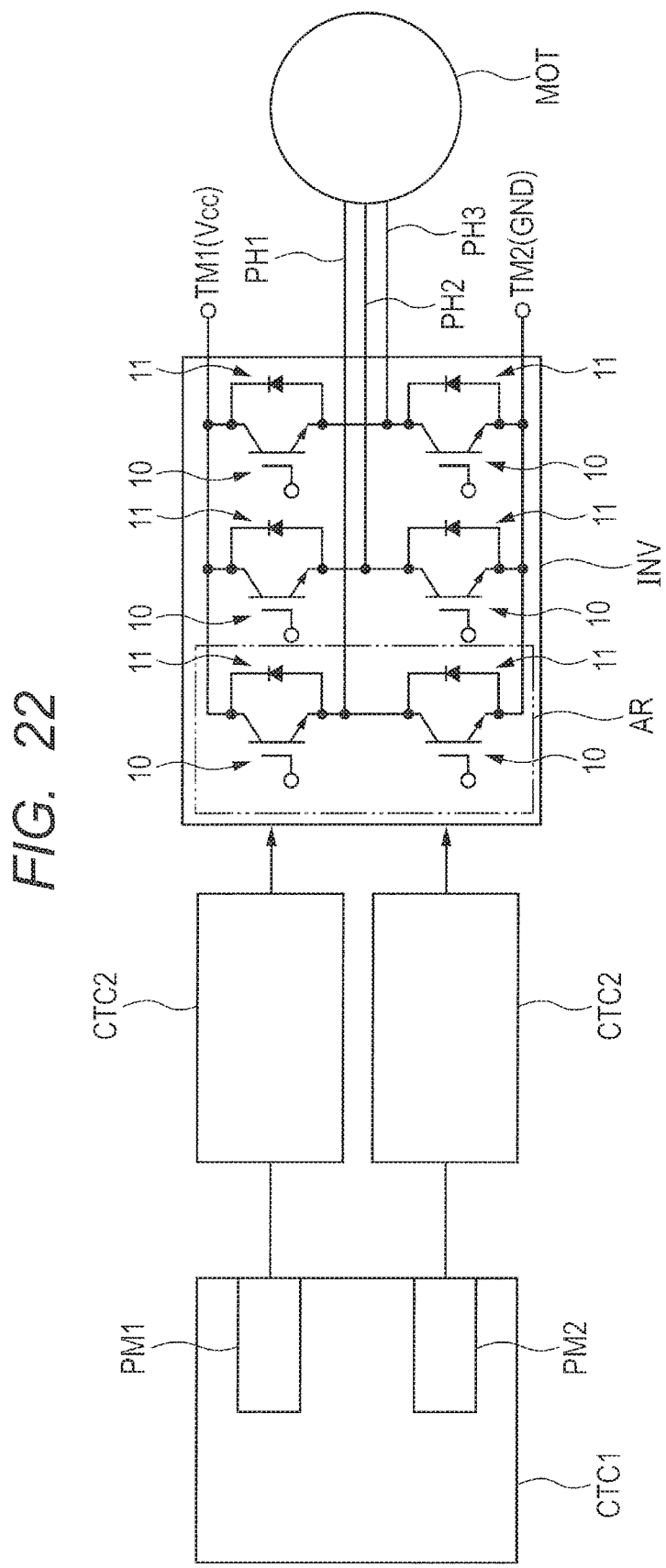
FIG. 22 is a circuit block diagram showing one example of an electronic system using a semiconductor device according to an embodiment 3.

FIG. 22 is a circuit block showing one example of an electronic system using the semiconductor device according to the embodiment 3. FIG. 23 is an equivalent circuit diagram showing a module as the semiconductor device according to the embodiment 3. FIG. 23 shows two IGBT modules 10 corresponding to a U phase PH1, of six IGBT modules 10 included in an inverter INV shown in FIG. 22.

As shown in FIG. 22, the electronic system using the semiconductor device according to the present embodiment 3 has a load such as a motor MOT or the like, the inverter INV, a control circuit CTC1, and control circuits CTC2. Such an electronic system is, for example, a solar power generation system or a wind power generation system. A three-phase motor is used as the motor MOT herein. The three-phase motor is configured to be driven by three-phase voltages different in phase. The control circuit CTC1 includes plural power modules PM1 and PM2.

In the electronic system shown in FIG. 22, the output of a power generation module (not shown) in, for example, a solar power generation system, a wind power generation system or a UPS (Uninterruptible Power Supply) is coupled to input terminals TM1 and TM2 of the inverter INV. A DC voltage, i.e., DC power of the power generation module is supplied to the inverter INV.

The control circuit CTC1 is configured by, for example, an ECU (Electronic Control Unit) and has a control semiconductor chip like an MCU (Micro Controller Unit) built therein. The control circuit CTC1 includes plural power modules PM1 and PM2. Each of the power modules PM1 and PM2 is also configured by, for example, an ECU and has a control semiconductor chip like an MCU built therein.

The power modules PM1 and PM2 included in the control circuit CTC1 are coupled to the control circuits CTC2. The inverter INV is controlled by the control circuits CTC2. Although illustration is omitted, the control circuit CTC2 includes, for example, a gate driver and a photocoupler. The gate driver (not shown) included in the control circuit CTC2 is coupled to the inverter INV. At this time, the gate driver (not shown) included in the control circuit CTC2 is coupled to a gate electrode of an IGBT provided in the inverter INV.

The motor MOT is coupled to the inverter INV. For example, the DC voltage, i.e., DC power supplied from the power generation module (not shown) in the solar power generation system or the wind power generation system to the inverter INV is converted into an AC voltage, i.e., AC power by the inverter INV, which in turn is supplied to the motor MOT. The motor MOT is driven by the AC voltage, i.e., AC power supplied from the inverter INV.

In the example shown in FIG. 22, the motor MOT is a three-phase motor comprised of a U phase PH1, a V phase PH2, and a W phase PH3. Therefore, the inverter INV also corresponds to the three phases comprised of the U phase PH1, V phase PH2, and W phase PH3. The inverter INV corresponding to such three phases has six sets of IGBT modules 10 and diode modules 11 in total.

The semiconductor device according to the present embodiment 3 corresponds to the IGBT module 10. Further, the IGBT module 10 includes a plurality of IGBT chips 12, each of which corresponds to the semiconductor chip CHP shown in FIG. 1.

Incidentally, when the motor MOT is a two-phase motor, the inverter INV has four sets of IGBT modules 10 and diode modules 11 in total.

The power supply voltage Vcc side of the inverter INV than the input potential of the motor MOT is referred to as a highside. Further, the ground potential GND side of the inverter INV than the input potential of the motor MOT is referred to as a lowside. In the example shown in FIG. 22, the three IGBT modules 10 are used as the highside IGBT modules 10. The three IGBT modules 10 are used as the lowside IGBT modules. Further, the three diode modules 11 are used as the highside diode modules 11, and the three diode modules 11 are used as the lowside diode modules 11.

Figure 23:
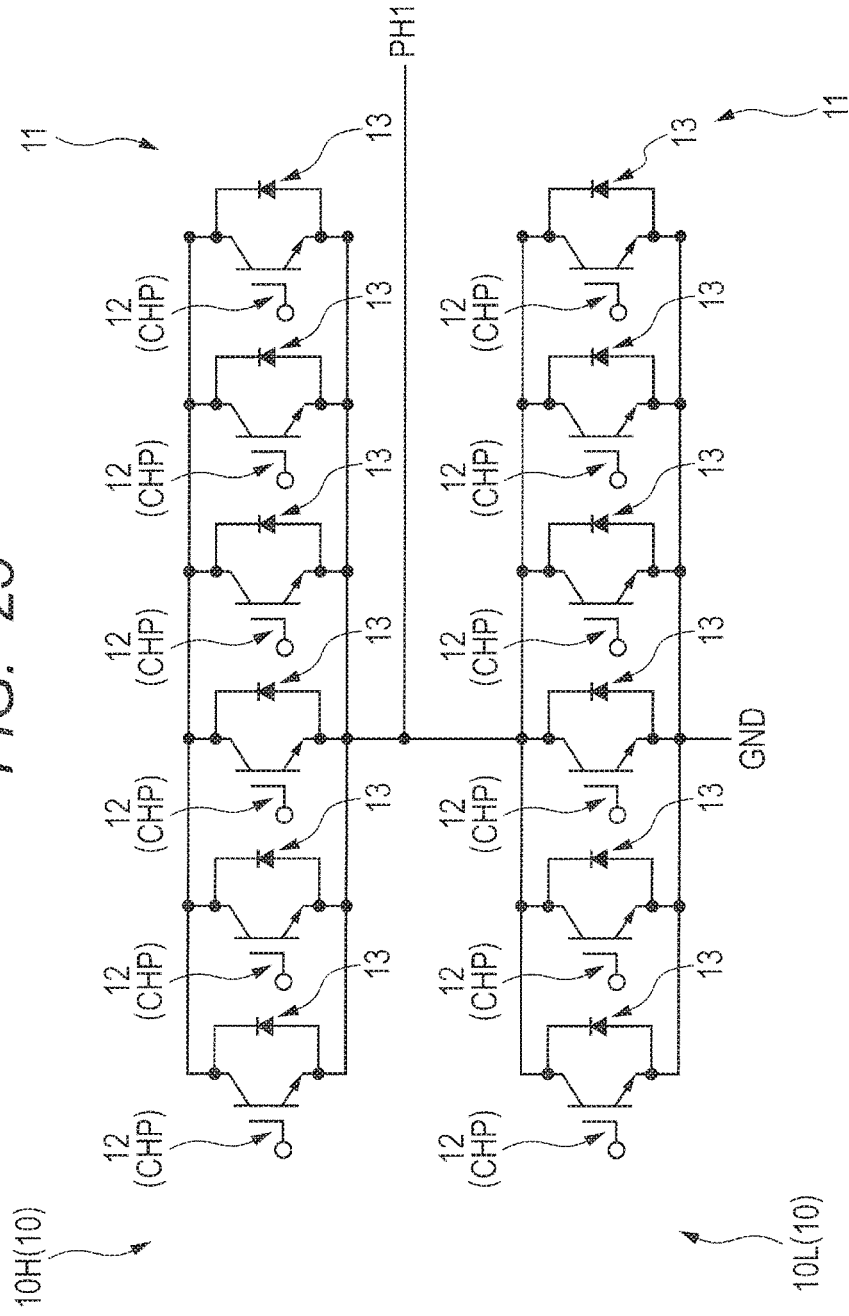
FIG. 23 is an equivalent circuit diagram showing a module as the semiconductor device according to the embodiment 3.

Of the two IGBT modules 10 shown in an area AR of FIG. 22, corresponding to the U phase, for example, the highside IGBT module 10H is equipped with plural, e.g., six IGBT chips 12 each comprised of a semiconductor chip CHP as shown in FIG. 23. Further, of the two IGBT modules 10 corresponding to the U phase, for example, the lowside IGBT module 10L is equipped with plural, e.g., six IGBT chips 12 each comprised of a semiconductor chip CHP. Even in both of the highside and the lowside, respective emitter potential electrodes EE of the IGBT chips 12 are electrically coupled to each other, and respective collector potential electrodes CE of the IGBT chips 12 are electrically coupled to each other.

In the example shown in FIG. 22, the IGBT modules 10 and the diode modules 11 are coupled in reverse-parallel between the power supply voltage Vcc supplied to the inverter INV through the input terminals TM1 and TM2 and the input potential of the motor MOT, i.e., to the highside for each phase of the three phases comprised of the U phase PH1, V phase PH2, and W phase PH3. Further, the IGBT modules 10 and the diode modules 11 are coupled in reverse-parallel between the input potential of the motor MOT and a ground potential GND, i.e., to the lowside for each phase of the three phases comprised of the U phase PH1, the V phase PH2, and the W phase PH3.

Further, the control circuit CTC2 is coupled to the respective gate electrodes of the IGBT chips 12 included in each of the six IGBT modules 10. Each of the IGBT chips 12 included in the six IGBT modules 10 is controlled by the control circuit CTC2. Incidentally, as shown in FIG. 23, each of the two diode modules 11 includes a plurality of diodes 13. Each IGBT chip 12 and each diode 13 are coupled in reverse-parallel.

A current flowing through each IGBT module 10 is controlled using the control circuit CTC2 to thereby drive and rotate the motor MOT. That is, the motor MOT can be driven by controlling on/off of each IGBT module 10 by using the control circuit CTC2. While the IGBT module 10 is required to be turned on and off when the motor MOT is driven in this way, the motor MOT includes an inductance. Thus, when the IGBT module 10 is turned off, a backward current in the direction opposite to the direction in which the current of the IGBT module 10 flows is generated by the inductance included in the motor MOT. Since the IGBT module 10 does not have a function of making the backward current flow, the diode module 11 is provided in reverse-parallel to the IGBT module 10 to thereby circulate the backward current and release energy accumulated in the inductance.

As described above, the semiconductor chip CHP described in the aforementioned embodiment 1 or embodiment 2 has been applied to the IGBT chip 12 of the embodiment 3. Therefore, since the switching loss at the turn on is improved in each of the IGBT chips 12, the inverter INV having these IGBT chips can be driven with lower power consumption than in the related art. Accordingly, it is possible to effectively utilize power in the solar power generation system, the wind power generation system or the UPS. Further, a power conditioner or the like with the generation of power taken as an interface is capable of contributing even to an improvement in power generation amount by enhancing power efficiency.

Although the invention made above by the present inventors of the present application has been described specifically on the basis of the preferred embodiments, the present invention is not limited to the embodiments referred to above. Various changes can be made thereto within the scope not departing from the spirit thereof.

What is claimed is:

1. A semiconductor device having a first area and a second area being an area different from the first area, comprising:
    a first impurity region of a first conductivity type formed in a semiconductor substrate in each of the first and second areas;
    a second impurity region of a second conductivity type formed in the first impurity region in each of the first and second areas, the second conductivity type being a conductivity type opposite to the first conductivity type;
    a third impurity region of the first conductivity type formed in the second impurity region in the first area;
    a fourth impurity region of the second conductivity type formed in the semiconductor substrate below the first impurity region in each of the first and second areas;
    a first trench which penetrates the second impurity region and the third impurity region and reaches the first impurity region in the first area;
    a first gate insulating film formed over an inner wall of the first trench;
    a first gate electrode formed over the first gate insulating film so as to be embedded in the first trench;
    a gate potential electrode for supplying a gate potential;
    an emitter potential electrode for supplying an emitter potential; and
    a collector potential electrode for supplying a collector potential;
    wherein the first gate electrode extends in a first direction in plan view,
    wherein the plural third impurity region are formed to separate from each other in the first direction by the second impurity region in plan view,
    wherein the second area includes a plurality of third areas each including:
    a second trench which penetrates the second impurity region and reaches the first impurity region,
    a second gate insulating film formed over an inner wall of the second trench, and
    a ring-shaped second gate electrode formed over the second gate insulating film so as to be embedded in the second trench and formed so as to surround a part of the second impurity region in the second area in plan view,
    wherein the third areas are arranged to be separated from each other along the first direction in plan view,
    wherein the second impurity regions in the third areas are respectively unformed with the third impurity region,
    wherein the first gate electrode is electrically coupled to the gate potential electrode,
    wherein the fourth impurity region is electrically coupled to the collector potential electrode, and
    wherein the second impurity regions and the third impurity regions in the first area, the second impurity region in each of the third areas, and the second gate electrode are electrically coupled to the emitter potential electrode.

2. The semiconductor device according to claim 1,
wherein an interlayer insulating film is formed over the semiconductor substrate in the third areas,
wherein a plurality of first contact holes are formed in the interlayer insulating film,
wherein the first contact holes respectively reach the second impurity region surrounded by the second gate electrode, and
wherein the emitter potential electrode is formed to fill the inside of the first contact holes.

3. The semiconductor device according to claim 2,
wherein a part of the second gate electrode is led out to the outside of the second trench to configure a gate lead-out portion,
wherein the interlayer insulating film is formed to cover the gate lead-out portion,
wherein a second contact hole reaching the gate lead-out portion is formed in the interlayer insulating film, and
wherein the emitter potential electrode is formed to fill the inside of the second contact hole.

4. The semiconductor device according to claim 3,
wherein each of the third areas is divided into first and second parts,
wherein the first part and the second part respectively have the ring-shaped second gate electrode, and
wherein the second gate electrode in the first part and the second gate electrode in the second part are coupled through the gate lead-out portion.

5. The semiconductor device according to claim 1,
wherein the first impurity region in the second area is formed with a fifth impurity region of the second conductivity type having an impurity concentration lower than that of the second impurity region and reaching a position deeper than the bottom of the first trench and the bottom of the second trench, between the first area and the third area adjacent to each other in a second direction orthogonal to the first direction in plan view and between the third areas adjacent to each other in the first direction in plan view.

6. The semiconductor device according to claim 5,
wherein a sixth impurity region of the first conductivity type having an impurity concentration higher than that of the first impurity region is formed to divide the fifth impurity region formed between the first area and the third area adjacent in the second direction in plan view.

7. The semiconductor device according to claim 5,
wherein the two first gate electrodes are formed in the first area, and
wherein the second impurity region and the third impurity regions in the first area are formed between the two first gate electrodes in plan view.

8. The semiconductor device according to claim 7,
wherein when the distance between the third areas adjacent to each other in the first direction is defined as L2, and the distance between the first area and the third area adjacent in the second direction is defined as L1 in plan view, L2 is larger than L1.

9. The semiconductor device according to claim 8,
wherein
in the case the width of the first area is defined as W1, and the width of the third area is defined as W3 in the second direction, W3 is more than or equal to W1.

10. The semiconductor device according to claim 8,
wherein in the case the width of the first area is defined as W1, and the width of the second area is defined as W2 in the second direction, W1:W2 is within a range from 1:5 to 1:9.

11. The semiconductor device according to claim 10,
further including the two first areas,
wherein in the second direction, W2 being the width of the second area is comprised of W4 being the width of the fifth impurity region formed between one of the first areas and the third area, W3 being the width of the third area, and W5 being the width of the fifth impurity region formed between the other of the first areas and the third area, and
wherein W1:W4:W3:W5 is within a range from 1:2:1:2 to 1:4:1:4.

12. The semiconductor device according to claim 8,
wherein L1:L2 is within a range from 1:6 to 1:11.

13. The semiconductor device according to claim 8,
wherein an input capacitance of the semiconductor device with respect to a unit area of the first area is less than or equal to 140 pF/mm$^2$.

14. The semiconductor device according to claim 5,
wherein the first impurity region between the two first gate electrodes in the first area, and the first impurity region surrounded by the second gate electrode in the third area are respectively formed with a seventh impurity region of the second conductivity type which is disposed below the second impurity region and which has an impurity concentration higher than that of the first impurity region and has an impurity concentration lower than that of the third impurity region.

15. The semiconductor device according to claim 1,
wherein the first conductivity type is an n type, and
wherein the second conductivity type is a p type.

16. The semiconductor device according to claim 1,
including a plurality of semiconductor chips each comprised of the semiconductor device,
wherein the respective emitter potential electrodes of the semiconductor chips are electrically coupled to each other, and
wherein the respective collector potential electrodes of the semiconductor chips are electrically coupled to each other.

* * * * *